United States Patent
Hua et al.

(10) Patent No.: US 12,255,674 B2
(45) Date of Patent: Mar. 18, 2025

(54) CONSTANT-PHASE ATTENUATOR TECHNIQUES IN RADIO FREQUENCY FRONT END (RFFE) AMPLIFIERS

(71) Applicant: QUALCOMM Incorporated, San Diego, CA (US)

(72) Inventors: Xingyi Hua, San Diego, CA (US); Bassel Hanafi, San Diego, CA (US); Karthik Tripurari Jayaraman, San Diego, CA (US); Francesco Gatta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 557 days.

(21) Appl. No.: 17/580,320

(22) Filed: Jan. 20, 2022

(65) Prior Publication Data
US 2023/0231586 A1    Jul. 20, 2023

(51) Int. Cl.
*H03F 1/22*    (2006.01)
*H03F 1/56*    (2006.01)
*H04B 1/04*    (2006.01)

(52) U.S. Cl.
CPC ........... *H04B 1/0483* (2013.01); *H03F 1/565* (2013.01); *H03F 2200/451* (2013.01)

(58) Field of Classification Search
CPC .................................. H03F 1/22; H03F 1/12
USPC ................................................. 330/311, 51
See application file for complete search history.

(56) References Cited

U.S. PATENT DOCUMENTS

| 6,438,364 | B1 * | 8/2002 | Waite .................. H03F 1/32 |
| | | | 455/333 |
| 10,340,861 | B2 | 7/2019 | Ye et al. |
| 11,967,935 | B2 * | 4/2024 | Ayranci ............. H03F 1/223 |
| 2013/0190036 | A1 | 7/2013 | Zhao et al. |
| 2022/0345089 | A1 * | 10/2022 | Ayranci ............ H03G 3/3052 |

OTHER PUBLICATIONS

Floyd B.A., et al., "Low-Noise Amplifier Comparison at 2 GHz in 0.25-μm and 0.18-μm RF-CMOS and SiGe BiCMOS", 2004 IEEE Radio Frequency Integrated Circuits Symposium (RFIC), Digest of Papers, IEEE Fort Worth, TX, USA, Jun. 6-8, 2004, Piscataway, NJ, USA, Jun. 6, 2004, XP010713767, pp. 185-188, p. 185, left-hand column, line 22—p. 188, right-hand column, line 5, figures 1-3.
International Search Report and Written Opinion—PCT/US2022/082082—ISA/EPO—Apr. 12, 2023.

* cited by examiner

*Primary Examiner* — Henry Choe
(74) *Attorney, Agent, or Firm* — Polsinelli

(57) ABSTRACT

Aspects of the disclosure relate to devices, wireless communication apparatuses, methods, and circuitry implementing a low noise amplifier (LNA) with phase-shifting circuitry to achieve a continuous phase at the output of the LNA. One aspect is an amplifier including a high gain active path comprising active circuitry, and a low gain path comprising passive circuitry and phase-shifting circuitry. In one or more aspects, the phase-shifting circuitry is configured to shift a phase of an input signal within the low gain path such that the phase of an output signal outputted from the low gain path approximately matches a phase of an output signal outputted from the high gain active path. In at least one aspect, a gain of the high gain active path is higher than a gain of the low gain passive path.

20 Claims, 13 Drawing Sheets

CONSTANT-PHASE ATTENUATOR TECHNIQUES IN RADIO FREQUENCY FRONT END (RFFE) AMPLIFIERS

TECHNICAL FIELD

This present disclosure generally relates to electronic communications. For example, aspects of the present disclosure relate to low noise amplifiers (LNAs) with phase-shifting circuitry.

BACKGROUND

Many of the services provided by electronic devices in the current interconnected world depend at least partly on electronic communications. Electronic communications can include those exchanged between or among distributed electronic devices using wireless or wired signals that are transmitted over one or more networks, such as the Internet or a cellular network. Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

Multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard.

Electronic devices are expected to be able to sufficiently process received signals from wireless communications. Typically, in wireless communications, prior to a receiver processing a received signal, a low noise amplifier (LNA) will amplify the received signal to an amplitude that meets the receiver's requirements for processing. A LNA may have different gain states corresponding to different levels of amplification applied to an incoming signal. Different gain states may be used based on detection of different operating conditions. It is valuable for an LNA to be able operate efficiently and effectively across the different gain states while interoperating well with downstream circuitry.

SUMMARY

Disclosed are systems, apparatuses, methods, and computer-readable media for electronic communications and, more specifically, to devices, wireless communication apparatuses, and circuitry implementing an LNA with phase-shifting circuitry. Some aspects of phase-shifting circuitry as described herein improve the operation of the LNA, which comprises a high gain active path and a low gain passive path, by resolving a discontinuity in phase at the output of the LNA by shifting the phase of the signal within the low gain path to match the phase of the signal within the high gain path.

In one aspect, an amplifier is provided. The amplifier has an input and an output and comprising: a high gain path coupled between the input and the output and comprising active circuitry; and a low gain path coupled between the input and the output and comprising phase-shifting circuitry, wherein the phase-shifting circuitry is configured to shift a phase of an input signal within the low gain path such that the phase of an output signal at the output of the amplifier from the low gain path approximately matches a phase of the output signal at the output of the amplifier from the high gain path, and wherein a gain of the high gain path is higher than a gain of the low gain path.

In some aspects the phase-shifting circuitry comprises at least one inductor and at least one capacitor.

In some aspects at least one of the at least one capacitor is a tunable capacitor that is configured to tune an amount of shift of the phase of the input signal within the low gain path.

In some aspects at least one of the at least one capacitor is configured to be disabled to disable the phase-shifting circuitry such that the phase of the input signal within the low gain path is not shifted.

In some aspects at least one of the at least one inductor of the phase-shifting circuitry forms at least a portion of an impedance matching circuit.

In some aspects at least one of the at least one inductor is a center-tapped inductor.

In some aspects the amplifier comprises a capacitor in series with the phase shifting circuitry.

In some aspects the phase shifting circuitry comprises an inductor coupled in series between the input and the output of the amplifier, the phase shifting circuitry further comprising a first shunt capacitor and a second shunt capacitor, the inductor coupled between the first shunt capacitor and the second shunt capacitor.

In some aspects the first shunt capacitor and the second shunt capacitor are variable capacitors.

In some aspects the inductor is tapped by a third shunt capacitor.

In some aspects the third shunt capacitor is coupled in parallel to a switch.

In some aspects the amplifier further comprises a capacitor coupled in series with the inductor, the first shunt capacitor coupled between the capacitor and the inductor.

In some aspects the inductor forms a portion of an impedance matching network of the low gain path.

In some aspects the amplifier further comprises a switch coupled between the input and the inductor.

In some aspects the phase-shifting circuitry provides for at least one of a positive 180 degrees phase shift or a negative 180 degrees phase shift.

In some aspects the phase-shifting circuitry comprises two capacitors coupled together in series and coupled to one inductor.

In some aspects the phase-shifting circuitry comprises a first inductor coupled to a first end of a capacitor, and a second inductor coupled to a second end of the capacitor.

In some aspects the phase-shifting circuitry comprises two inductors coupled together in in series, and a shunt capacitor having a first end coupled between the two inductors and a second end coupled to ground.

In some aspects the phase-shifting circuitry comprises a first capacitor coupled to a first end of an inductor, and a second capacitor coupled to a second end of the inductor.

In some aspects the active circuitry comprises at least one transistor having a gate coupled to an input of the amplifier, a source coupled to ground, and a load coupled between a power supply and a drain of the at least one transistor.

In some aspects the amplifier is a low noise amplifier (LNA), and wherein the gain of the low gain path is approximately zero such that the low gain path is a bypass path bypassing the active circuitry of the high gain path.

In another aspect a method is provided for operation of an amplifier. The method comprises: outputting, by a high gain active path comprising active circuitry, a first signal comprising a first phase; receiving, by a low gain passive path comprising passive circuitry, a second signal comprising a second phase, wherein a gain of the high gain active path is higher than a gain of the low gain passive path; shifting, by a phase-shifting circuitry within the low gain passive path, the second phase of the second signal to a third phase to generate a third signal comprising the third phase; and outputting, by the low gain passive path, the third signal comprising the third phase, wherein the third phase approximately matches the first phase.

In some aspects the phase-shifting circuitry comprises at least one inductor and at least one capacitor, and wherein at least one of the at least one capacitor is a tunable capacitor that is configured to tune an amount of shift of the second phase of the second signal within the low gain passive path.

In some aspects the method further comprises disabling the phase-shifting circuitry such that the second phase of the second signal within the low gain passive path is not shifted.

In some aspects at least one of the at least one inductor provides for phase-shifting and impedance matching.

In some aspects one of the at least one capacitor is a series capacitor that provides for an improved quality factor (Q) for the amplifier, which corrects for any phase slope differences between the third phase of the third signal outputted from the low gain passive path and the first phase of the first signal outputted from the high gain active path.

In another aspect, an amplifier is provided. The amplifier comprises: phase-shifting circuitry, within a bypass path of the amplifier, the bypass path bypassing one or more gain providing elements in an active path of the amplifier, the phase-shifting circuitry comprising an inductor and at least one capacitor, wherein the inductor provides both impedance matching and phase-shifting of at least one signal within the bypass path of the amplifier.

In another aspect, an amplifier is provided, the amplifier having an output and comprising: a high gain path coupled to the output and comprising active circuitry; and a low gain path coupled to the output and comprising means for shifting a phase of a signal in the low gain path such that the phase of an output signal at the output of the amplifier from the low gain path approximately matches a phase of the output signal at the output of the amplifier from the high gain path, and wherein a gain of the high gain path is higher than a gain of the low gain path.

In some aspects the phase of the output signal at the output of the amplifier from the low gain path is within ±15° of the phase of the output signal at the output of the amplifier from the high gain path.

In one or more examples, a wireless communication apparatus is provided. The wireless communication apparatus comprises an amplifier. In one or more examples, the amplifier comprises a high gain active path comprising active circuitry, and a low gain passive path comprising passive circuitry and phase-shifting circuitry. In one or more examples, the phase-shifting circuitry is configured to shift a phase of an input signal within the low gain passive path such that the phase of an output signal outputted from the low gain passive path approximately matches a phase of an output signal outputted from the high gain active path. In at least one example, a gain of the high gain active path is higher than a gain of the low gain passive path.

In one or more examples, the phase-shifting circuitry comprises at least one inductor and at least one capacitor. In at least one example, at least one capacitor is a tunable capacitor that is configured to tune an amount of shift of the phase of the input signal within the low gain passive path. In some examples, at least one capacitor is disabled to disable the phase-shifting circuitry such that the phase of the input signal within the low gain passive path is not shifted.

In at least one example, at least one inductor provides for phase-shifting and impedance matching. In one or more examples, at least one inductor is tied to ground to form a traditional transformer. In some examples, at least one inductor is a center-tapped inductor.

In one or more examples, one capacitor is a series capacitor that provides for an improved quality factor (Q) for the amplifier, which corrects for any phase slope differences between the phase of the output signal outputted from the low gain passive path and the phase of the output signal outputted from the high gain active path.

In at least one example, the phase-shifting circuitry provides for at least one of up to positive 180 degrees (°) in phase shift or down to negative 180° in phase shift. In some examples, the phase-shifting circuitry comprises two capacitors coupled together in series and coupled to one inductor. In one or more examples, the phase-shifting circuitry comprises a first inductor coupled to a first end of a capacitor, and a second inductor coupled to a second end of the capacitor. In at least one example, the phase-shifting circuitry comprises two inductors coupled together in in series and coupled to a capacitor. In one or more examples, the phase-shifting circuitry comprises a first capacitor coupled to a first end of an inductor, and a second capacitor coupled to a second end of the inductor.

In one or more examples, the active circuitry comprises a gain mode (GM) transistor. In at least one example, the passive circuitry comprises at least one inductor and at least one capacitor. In one or more examples, the amplifier is an LNA.

In one or more examples, a method of operation for an amplifier comprises receiving and outputting, by a high gain active path comprising active circuitry, a first signal comprising a first phase. The method further comprises receiving, by a low gain passive path comprising passive circuitry, a second signal comprising a second phase. In one or more examples, a gain of the high gain active path is higher than a gain of the low gain passive path. The method also comprises shifting, by a phase-shifting circuitry within the low gain passive path, the second phase of the second signal to a third phase to generate a third signal comprising the third phase. Further, the method comprises outputting, by the low gain passive path, the third signal comprising the third phase, wherein the third phase approximately matches the first phase.

In one or more examples, an amplifier comprises phase-shifting circuitry, within a passive path of the amplifier, comprising an inductor and at least one capacitor. In at least one example, the inductor provides both impedance matching and phase-shifting of at least one signal within the passive path of the amplifier. In one or more examples, the inductor is a center-tapped inductor.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF DRAWINGS

Illustrative embodiments of the present application are described in detail below with reference to the following drawing figures.

DETAILED DESCRIPTION

Figure 1:
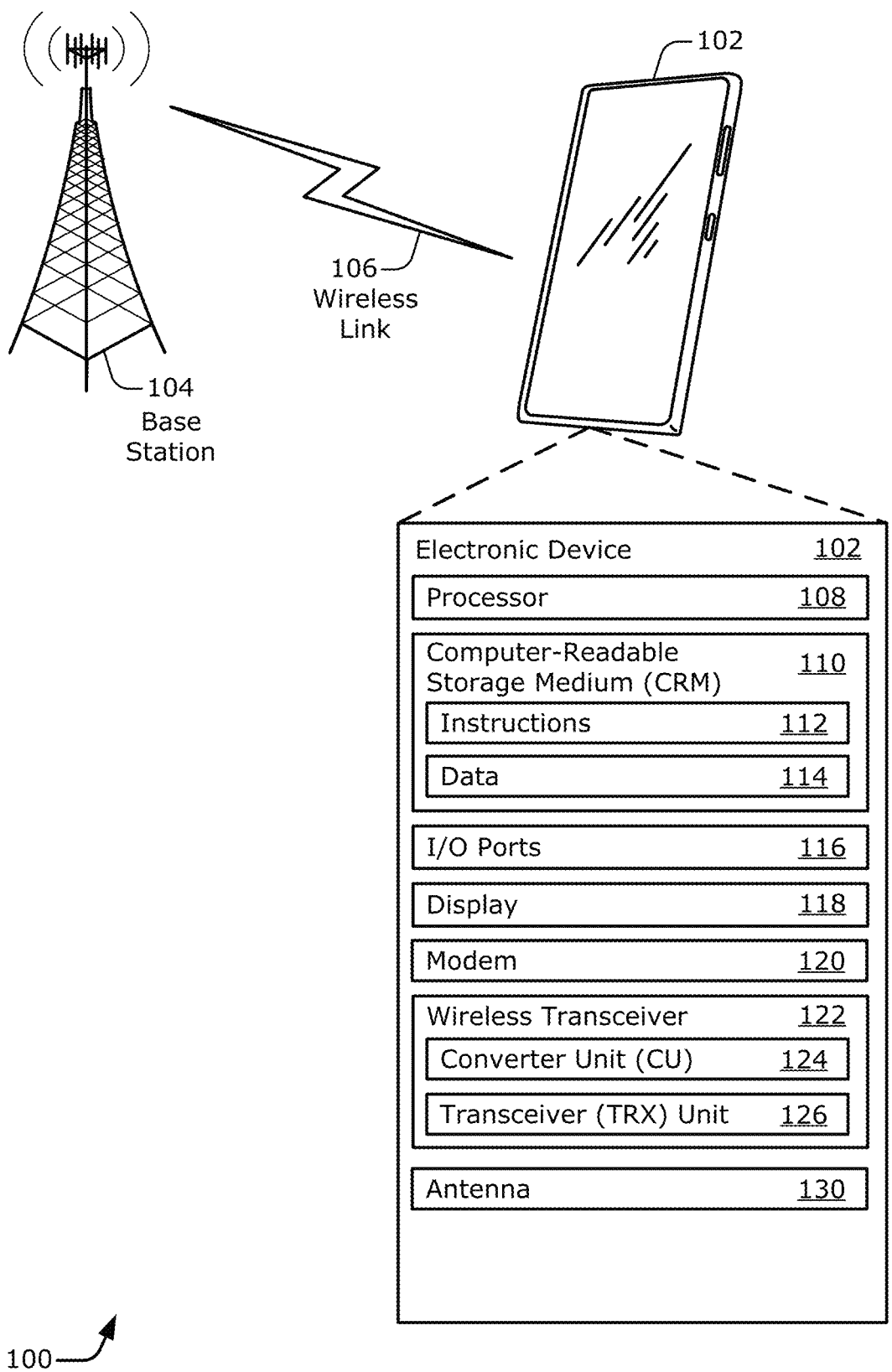
FIG. 1 illustrates an example environment that includes an electronic device having a wireless transceiver in which a receive path can include an implementation of the disclosed LNA with phase-shifting circuitry, in accordance with examples described herein.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments of the application. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the application as set forth in the appended claims.

Electronic devices are expected to be able to sufficiently process received signals from wireless communications. Generally, in wireless communications, after a signal is received by a receive antenna (or a transmit/receive antenna), the received signal passes through a filter(s) (e.g., a bandpass filter(s) for bandpass filtering) and antenna switches. The signal is then amplified by a low noise amplifier (LNA) to a signal amplitude that is within an acceptable range for a receiver for processing (e.g., the receiver processing may include filtering, frequency conversion, digitization, etc.). The receiver may be a standalone receiver or may be within a transceiver. A radio frequency front end (RFFE) module may comprise the LNA along with the receive antenna, the filter(s), and/or the antenna switches.

In accordance with some aspects described herein, an LNA can comprise two gain paths. The two gain paths can provide multiple different gain settings (or gain modes) (e.g., G0, G1, G2, G3, and so on) that are used to amplify the signal to an amplitude level that is sufficient to meet the receiver's signal amplitude requirements for processing. In one example, the two gain paths of the LNA comprise a high gain path and a low gain path (or a bypass path). The high gain path comprises active circuitry (e.g., a transistor(s) or other gm devices). The low gain path may either include passive circuitry only or may potentially have some active components but applies a lower gain to the signal as compared to the high gain path. In some implementations, the low gain path may correspond to or be referred to as a bypass path because the low gain path bypasses the high gain path (e.g., bypass the active components such as bypassing certain gm devices providing gain) within the LNA. Switches within the LNA switch between the high gain path and the low gain path, and between the various different gain settings.

When the receive signal has a lower signal amplitude at the LNA, the switches are configured to switch such that the signal propagates within the LNA through the high gain path, which will amplify the signal accordingly. When the receive signal has a higher signal amplitude at the LNA, the switches are configured to switch such that the signal bypasses the high gain path and propagate within the LNA through the low gain path (e.g., the bypass path).

However, when the switches switch between the different gain settings, the phase of the signal outputted from the high gain path may be different than the phase of the signal outputted from the low gain path. This mismatch can result in the signal being outputted from the LNA to have a discontinuity in phase between different gain modes. The discontinuity in phase of the received signal at the receiver can cause inaccuracies in processing of the signal by the receiver. In some aspects, downstream circuits in a design may be configured for an expected or constant phase. In some aspects, downstream circuits in a design may be configured to avoid phase correction techniques applied after baseband conversion.

In order to avoid the receive signal to have a discontinuity in phase at the receiver, in one or more examples, the low gain path of the LNA is implemented with phase-shifting circuitry. The phase-shifting circuitry resolves the discontinuity in phase at the output of the LNA by shifting the phase of the signal within the low gain path to match the phase of the signal within the high gain path. Additional details regarding the disclosed LNA with phase-shifting circuitry as well as specific implementations are described below.

FIG. 1 illustrates an example environment 100 that includes an electronic device 102 having a wireless transceiver 122 in which a receive path can include an implementation of the disclosed LNA with phase-shifting circuitry, in accordance with examples described herein. In the environment 100, the electronic device 102 communicates with a base station 104 through a wireless communication link 106 (wireless link 106). In such an example, the electronic device 102 is depicted as a smart phone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server, network-attached storage (NAS) device, smart appliance, vehicle-based communication system, Internet-of-Things (IoT) device, and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, cable television head-end, terrestrial television broadcast tower, access point, peer-to-peer device, mesh network node, router, fiber optic line, another electronic device generally, and so forth. Hence, the electronic device 102 may communicate with the base station 104 or another device via a wired connection, a wireless connection, or a combination thereof.

The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE), 5G New Radio (3GPP 5GNR), IEEE 802.11, IEEE 802.16, Bluetooth™, and so forth.

The electronic device 102 includes a processor 108 and a computer-readable storage medium 110 (CRM 110). The processor 108 may include any type of processor, such as an application processor or a multi-core processor, that is configured to execute processor-executable instructions (e.g., code) stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus does not include transitory propagating signals or carrier waves.

The electronic device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 can be realized as a screen or projection that presents graphics, e.g.—one or more graphical images, of the electronic device 102, such as for a user interface associated with an operating system, program, or application. Alternatively, or additionally, the display 118 may be implemented as a display port or virtual interface through which graphical content of the electronic device 102 is communicated or presented.

For communication purposes, the electronic device 102 also includes a modem 120, a wireless transceiver 122, and at least one an antenna 130. The wireless transceiver 122 provides connectivity to respective networks and other electronic devices connected therewith using radio-frequency (RF) wireless signals. Additionally, or alternatively, the electronic device 102 may include a wired transceiver, such as an Ethernet or fiber optic interface for communicating over a personal or local network, an intranet, or the Internet. The wireless transceiver 122 may facilitate communication over any suitable type of wireless network, such as a wireless local area network (LAN) (WLAN) such as Wi-Fi or Bluetooth, a peer-to-peer (P2P) network, a mesh network, a cellular network (e.g., 3GPP2, 4G LTE, 5G NR, or other cellular network), a wireless wide-area-network (WWAN) (e.g., based on 3GPP2, 4G LTE, 5G NR, etc.), a navigational network (e.g., the Global Positioning System (GPS) of North America or another Satellite Positioning System (SPS)), and/or a wireless personal-area-network (WPAN). In the context of the example environment 100, the wireless transceiver 122 enables the electronic device 102 to communicate with the base station 104 and networks connected therewith. Other figures referenced herein may pertain to other wireless networks.

The modem 120, such as a baseband modem, may be implemented as a system on-chip (SoC) that provides a digital communication interface for data, voice, messaging, and other applications of the electronic device 102. The modem 120 may also include baseband circuitry to perform high-rate sampling processes that can include analog-to-digital conversion (ADC), digital-to-analog conversion (DAC), gain correction, skew correction, frequency translation, and so forth. The modem 120 may also include logic to perform in-phase/quadrature (I/Q) operations, such as synthesis, encoding, modulation, demodulation, and decoding. More generally, the modem 120 may be realized as a digital signal processor (DSP) or a processor that is configured to perform signal processing to support communications via one or more networks. Alternatively, ADC or DAC operations may be performed by a separate component or another illustrated component, such as the wireless transceiver 122.

The wireless transceiver 122 can include circuitry, logic, and other hardware for transmitting or receiving a wireless signal for at least one communication frequency band. In operation, the wireless transceiver 122 can implement at least one radio-frequency transceiver unit to process data and/or signals associated with communicating data of the electronic device 102 via the antenna 130. Generally, the wireless transceiver 122 can include filters, switches, amplifiers, and so forth for routing and processing signals that are transmitted or received via the antenna 130. Generally, the wireless transceiver 122 includes multiple transceiver units (e.g., for different wireless protocols such as WLAN versus WWAN or for supporting different frequency bands or frequency band combinations).

The filters, switches, amplifiers, mixers, and so forth of wireless transceiver 122 can include, in one example, at least one single-ended amplifier, switch circuitry, at least one transformer, at least one differential amplifier, and at least one mixer. In some implementations, the single-ended amplifier, which amplifies a strength of a signal, is coupled to the antenna 130. Thus, the single-ended amplifier can couple a wireless signal to or from the antenna 130 in addition to increasing a strength of the signal. In some implementations, the wireless transceiver 122 may comprise the disclosed LNA comprising phase-shifting circuitry. In particular, in some implementations, the transceiver (TRX) unit 126, of the wireless transceiver 122, may comprise the disclosed LNA comprising phase-shifting circuitry.

In some implementations, the switch circuitry can switchably couple individual transformers a set of transformers to the single-ended amplifier. The set of transformers provides a physical or electrical separation between the single-ended amplifier and other circuitry of the wireless transceiver 122. The set of transformers also conditions a signal propagating through the set of transformers. Outputs of a transformer can be coupled to one or more mixers.

Some examples can use a differential amplifier at the output of the transformer before the signal is input to a mixer. In such examples, the differential amplifier, like the single-ended amplifier, reinforces a strength of a propagating signal. The wireless transceiver can further perform frequency conversion using a synthesized signal and the mixer. The mixer may include an upconverter and/or a downconverter that performs frequency conversion in a single conversion step, or through multiple conversion steps. The wireless transceiver 122 may also include logic (not shown) to perform in-phase/quadrature (I/Q) operations, such as synthesis, encoding, modulation, demodulation, and decoding using a synthesized signal.

In some cases, components of the wireless transceiver 122, or a transceiver unit 126 thereof, are implemented as separate receiver and transmitter entities. Additionally or alternatively, the wireless transceiver 122 can be realized using multiple or different sections to implement respective receiving and transmitting operations (e.g., using separate transmit and receive chains). Example implementations of a transceiver unit 126 are described below with reference to FIG. 2. In addition, different wireless protocols such as WWAN and WLAN may be implemented on separate chips or as separate System-on-a-Chips (SoCs). As such, the blocks such as the modem 120 and transceiver 122 may represent more than one modem 120 or transceiver implemented either together on separate chips or separate SoCs.

Figure 2:
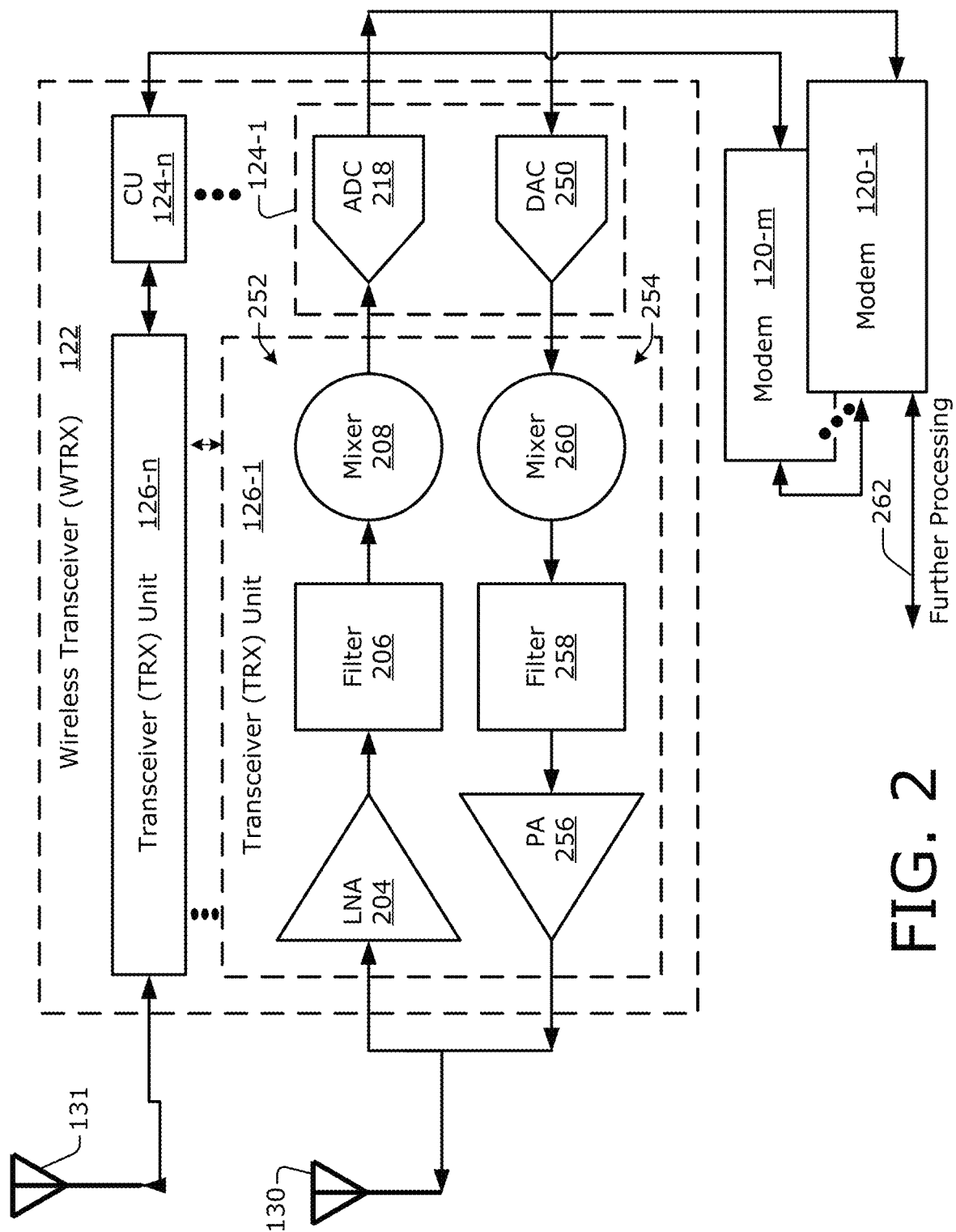
FIG. 2 illustrates an example of a wireless transceiver with transceiver units that can include an implementation of the disclosed LNA with phase-shifting circuitry, in accordance with examples described herein.

FIG. 2 illustrates an example of a wireless transceiver 122 with transceiver units 126-1 to 126-$n$ that can include an implementation of the disclosed LNA with phase-shifting circuitry, in accordance with examples described herein. In some examples, the components shown in FIG. 2 may be examples of some of the components of the electronic device 102 described with reference to FIG. 1. The wireless transceiver 122 is coupled to one or more of multiple modems 120-1 through 120-$m$, with "m" representing a positive integer. The wireless transceiver 122 includes one or more transceiver units 126-1 through 126-$n$, with "n" representing a positive integer. Each of the one or more transceiver units 126-1 through 126-$n$ may be associated with either different wireless protocols or associated with different frequency bands. For example, transceiver unit 126-1 may be associated with a WWAN wireless protocol (e.g., 4G LTE, 5G NR, or other WWAN wireless protocol) and be configured for transmitting or receiving using a particular set of frequency bands. Transceiver unit 126-$n$ may be associated with a WLAN wireless protocol such as Wi-Fi (e.g., in the 2.4 GHz Wi-Fi band or in the 5 GHz Wi-Fi band). Alternatively, transceiver unit 126-$n$ may be associated with a different set of frequency bands of a WWAN wireless protocol as compared to transceiver unit 126-1. As shown, different transceiver units 126-1 through 126-$n$ may be connected to different antennas 130 and 131, respectively. Alternatively, certain transceiver units 126-1 through 126-$n$ may share an antenna 130 (e.g., either through a frequency duplexing scheme or a time duplexing scheme and be routed via duplexers/diplexers or using other signal splitting techniques). In addition, there may be further antennas (not shown) for either other transceiver units, for use as diversity antennas, or for multiple-input, multiple-output (MIMO) applications.

As part of the wireless transceiver 122, each transceiver unit 126-1 to 126-$n$ is respectively coupled to an associated converter unit (CU) 124-1 to 124-$n$. Each converter unit 124, as depicted at the converter unit 124-1, can include an analog-to-digital converter (ADC) 218 or a digital-to-analog converter (DAC) 250. As shown, the transceiver unit 126-1 is coupled to the modem 120-1 (e.g., via the converter unit 124-1), and the transceiver unit 126-$n$ is coupled to the modem 120-$m$. However, multiple transceiver units 126 can be coupled to a same modem 120. Although only certain components are explicitly depicted in FIG. 2, the wireless transceiver 122 may include other non-illustrated components. Further, the converter units 124-1 to 124-$n$ may be separate from the wireless transceiver 122, such as by being part of a modem 120. The modems 120-1 through 120-$m$ may communicate with each other via communication pins (e.g., implementing a general purpose input-output (GPIO) scheme). Data received and processed via the modems 120-1 through 120-$m$ may be passed to other portions (e.g., applications processor, DSP, audio processor, and the like) of an electronic device 102 for further processing.

The transceiver unit 126-1 includes a receiver 252 (or receive chain or receive path) and a transmitter 254 (or transmit chain). In some implementations, a transceiver unit 126-1 may include a transmitter 254 (or transmit chain) without a receiver 252 (or receive chain), or vice versa. The receiver 252 includes a low noise amplifier 204 (LNA 204), a filter 206, and a mixer 208 for frequency down-conversion. The transmitter 254 includes a power amplifier 256 (PA 256), a filter 258, and a mixer 260 for up-conversion. In some implementations, the disclosed LNA comprising phase-shifting circuitry may be employed for the LNA 204.

The transceiver unit 126-1 can also include other components, such as additional amplifiers or multiple mixers, that are disposed anywhere along the depicted receive and transmit chains. These example components can at least partially implement a radio-frequency front-end (RFFE) for the associated electronic device 102. The receiver 252 is coupled between the antenna and the ADC 218, e.g., via the low noise amplifier 204 and the mixer 208, respectively. The transmitter 254 is coupled between the antenna and the DAC 250, e.g., via the power amplifier 256 and the mixer 260, respectively.

Thus, as shown for the receiver 252 of the transceiver unit 126-1, antenna is coupled to the low noise amplifier 204, and the low noise amplifier 204 is coupled to the filter 206. The filter 206 is coupled to the mixer 208, and the mixer 208 is coupled to the ADC 218. The ADC 218 is coupled to, or is part of, the modem 120-1. An example signal-receiving operation that includes the receiver 252 of the transceiver unit 126-1 and the antenna is described below. In some implementations, different transceiver units are associated with different wireless communication technologies, such as WWAN or WLAN. Additionally or alternatively, different transceiver units may provide parallel processing capabilities for a same wireless communication technology. In the example system of FIG. 2, LNA 204 is shown as part of the TRX unit 126-1. In other implementations, the LNA 204 (e.g., or any LNA for any corresponding TRX unit 126-$n$) can be implemented on a separate module that is connected to the TRX unit 126-1.

As part of a signal-transmitting operation, a baseband digital signal is provided to the digital-to-analog converter 250 (DAC 250). The DAC 250 converts the digital signal to an analog signal that is provided the mixer 260. The mixer 260 performs a frequency conversion on the analog signal to up-convert from one frequency to a higher frequency, such as from a baseband frequency to an intermediate frequency (IF) or a radio frequency (RF). The mixer 260 can perform the frequency up-conversion in a single conversion step, or through multiple conversion steps. Thus, the mixer 260 performs a frequency up-conversion operation on the analog signal to produce an up-converted signal and provides the up-converted signal to a filter 258. The filter 258 filters (e.g., low-pass filters or bandpass filters) the up-converted signal by attenuating some ranges of frequencies to produce a filtered signal that has one or more frequency bands attenuated. The filter 258 provides the filtered signal to a power amplifier 256.

Similarly, as part of a signal-receiving operation, a baseband digital signal received via the system above can be processed and output via an analog-to-digital converter (ADC 218) and modem(s) 120 for further processing 262. As part of an example signal-receiving operation, the antenna 130 can receive a signal that is processed via LNA and filter 206. The mixer 208 down converts the analog signal from an IF or RF signal to a baseband signal. ADC 218 then processes the baseband signal to generate a digital signal that is provided to modem(s) 120, and then output for further processing 262. Similar operations can be performed with any number of antennas such as antenna 131, and any number of TRX Units 126 and corresponding CUs 124 and modems 120.

The power amplifier 256 amplifies the filtered signal to produce an amplified signal at a power level appropriate for transmission. The amplifier 256 provides the amplified signal to the antenna 130.

Figure 3:
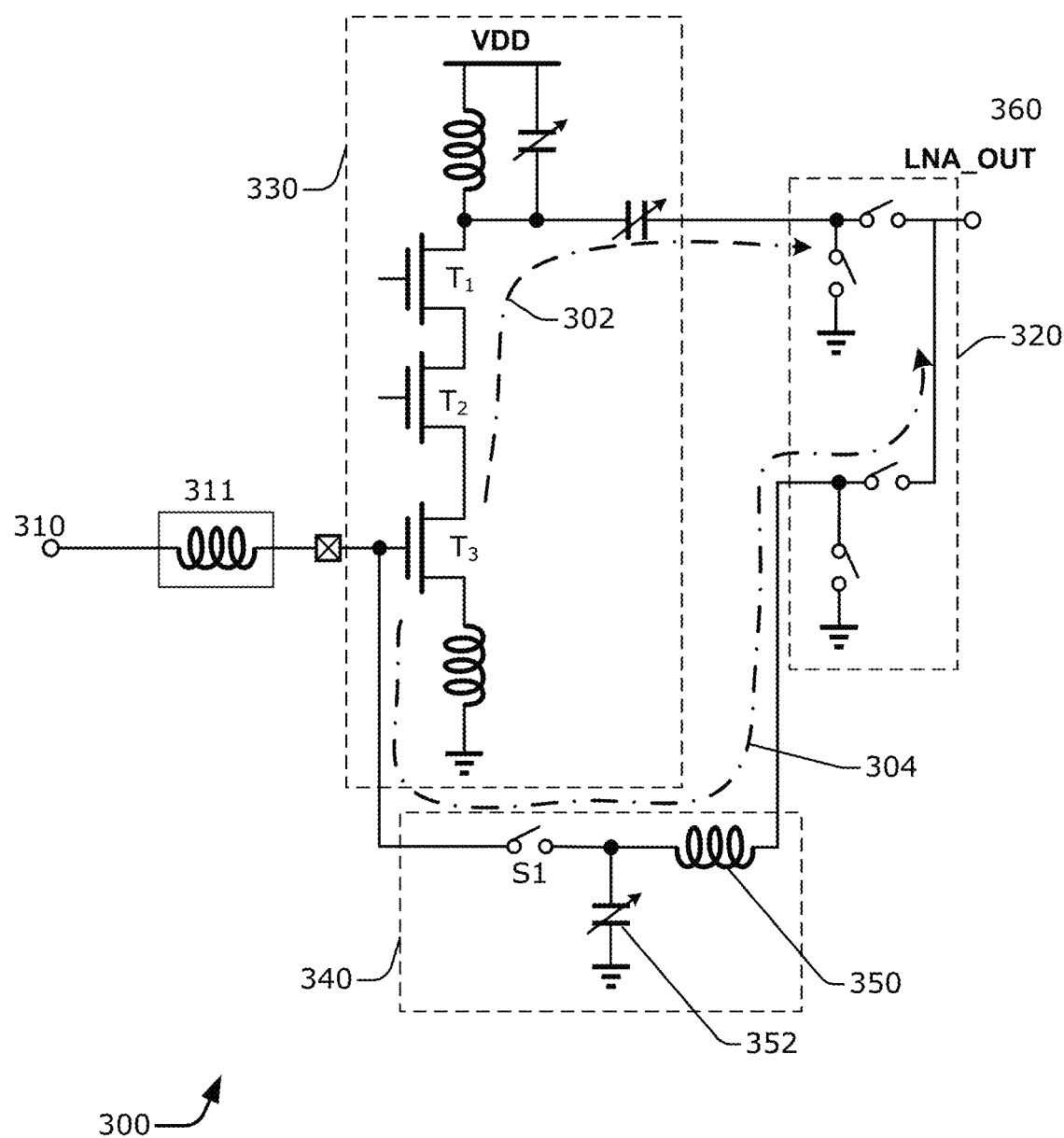
FIG. 3 is a diagram of an exemplary LNA without any phase compensation, which depicts the active high gain path and the passive low gain path within the LNA.

FIG. 3 is a diagram of an exemplary LNA 300 without any phase compensation, which depicts the active high gain path 302 and the passive low gain path 304 within the LNA 300. In this figure, the LNA 300 is shown to comprise two signal paths, which are the high gain active path 302 and the low gain passive path (e.g., bypass path) 304. The high gain active path 302 comprises active circuitry, such as transistor $T_3$ (e.g., providing a certain gain) along with transistors $T_1$ and $T_2$. The low gain passive path 304 comprises passive circuitry, such as an inductor (L) 350 and a capacitor (C) 352. These two signal paths can provide multiple different gain settings (or gain modes) (e.g., G0, G1, G2, G3, . . . ), which can comprise positive and negative gains. These multiple gain settings are used to amplify the receive signal to an amplitude level that is within an acceptable range for subsequent processing circuitry (e.g., a receiver, an analog-to-digital converter (A/D), etc.).

The LNA 300 comprises an operational switch (Op SW) 320, high gain circuitry 330, and low gain circuitry 340. The high gain circuitry 330, which is shown to comprise the transistors $T_1$, $T_2$, $T_3$, is the high gain active path of the LNA 300, and the low gain circuitry 340 is the low gain passive path of the LNA 300. The transistor $T_3$ has a gate, a source, and a drain, and is configured with the gate coupled to an input 310 of the LNA, the source coupled (via an inductor) to a ground, the drain coupled to a supply voltage via load circuitry (as well as via $T_1$, and $T_2$). The low gain circuitry 340 comprises an impedance matching inductor 350. The Op SW 320 is used for switching between the high gain circuitry 330 and the low gain circuitry 340, and for changing the gain settings (or gain modes). During operation, a signal is inputted into the input 310 of the LNA 300. The input inductor 311 can, in different implementations, be configured off-chip (e.g., separately from the LNA 300) or on-chip. The signal passes through the high gain circuitry 330 (e.g., for the path 302) or the low gain circuitry 340 (e.g., for the path 304), depending upon the switching within the Op SW 320. Since the LNA 300 does not provide for any phase compensation, the signal outputted from the output 360 of the LNA 300 will have a discontinuity in phase when the gain modes are changed.

Switches (e.g., switch S1) within the LNA 300 switch between the high gain active path 302 and the low gain passive path 304, and between the various different gain settings. In particular, for example, switch S1 when toggled, switches between the high gain active path 302 and the low gain passive path 304. When the switches of the LNA 300 switch between the different gain settings, the phase of the signal outputted from the high gain active path 302 will not match the phase of the signal outputted from the low gain passive path 304. The phase mismatch will result in the signal being outputted from the output 360 of the LNA 300 to have different phases based on which gain setting is being used.

FIGS. 4A, 4B, 4C, and 4D are diagrams showing various different phase-shifting circuitry 400, 410, 420, 430 that may be employed by the disclosed LNA with phase-shifting circuitry, in accordance with examples described herein. In some examples of the present disclosure, phase-shifting circuitry is incorporated into the low gain passive path (e.g., refer to path 304 of FIG. 3) of the disclosed LNA. This phase-shifting circuitry can resolve any discontinuity in phase at the output of the LNA by shifting the phase of the signal within the low gain passive path (e.g., refer to path 304 of FIG. 3) to match the phase of the signal output from the high gain active path (e.g., refer to path 302 of FIG. 3). In one or more examples, the phase-shifting circuitry 400, 410, 420, 430 of FIGS. 4A, 4B, 4C, and 4D provides for a fifty (50) ohm (Ω) input and a 50Ω output.

Figure 4A:
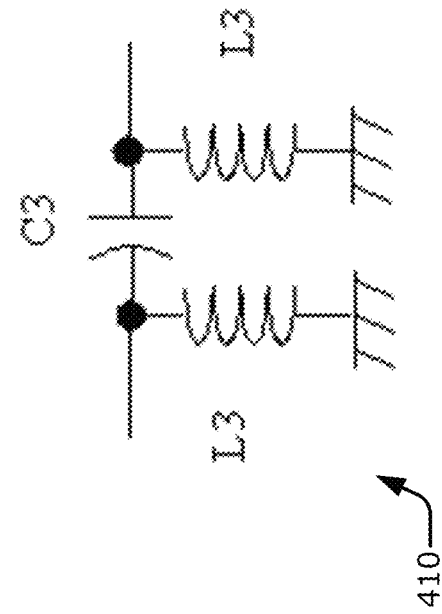
FIGS. 4A, 4B, 4C, and 4D are diagrams showing various different phase-shifting circuit blocks that may be employed by the disclosed LNA with phase-shifting circuitry, in accordance with examples described herein.
Figure 4B:
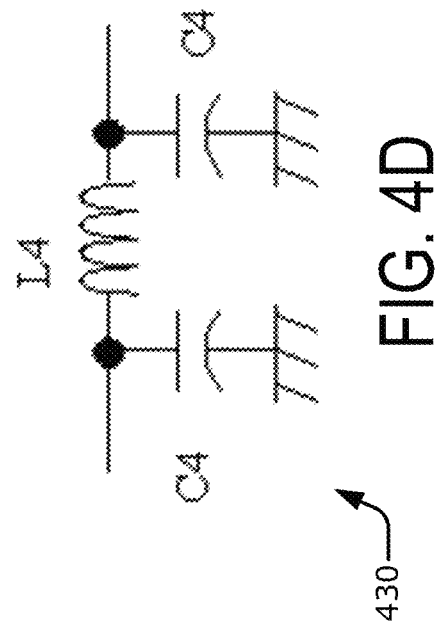

In particular, FIG. 4A is a diagram showing high pass tee phase-shifting circuitry 400. The circuitry 400 comprises two capacitors C1, C1 coupled together in series, and both coupled to an inductor L1. The inductor L1 is coupled in parallel (e.g., in a shunt path) as illustrated. As described herein, a shunt element is an element with one end connected to a signal path and another end connected to a reference voltage or ground (e.g., shunt capacitors C2 and C4 or shunt inductors L1 and L3). FIG. 4B is a diagram showing high pass pi phase-shifting circuitry 410. The circuitry 410 comprises a capacitor C3 coupled to two inductors L3, L3, where a first inductor L3 is coupled to a first end of the capacitor C3, and a second inductor L3 is coupled to a second end of the capacitor C3, with the inductors L3 in a shunt path.

Figure 4C:
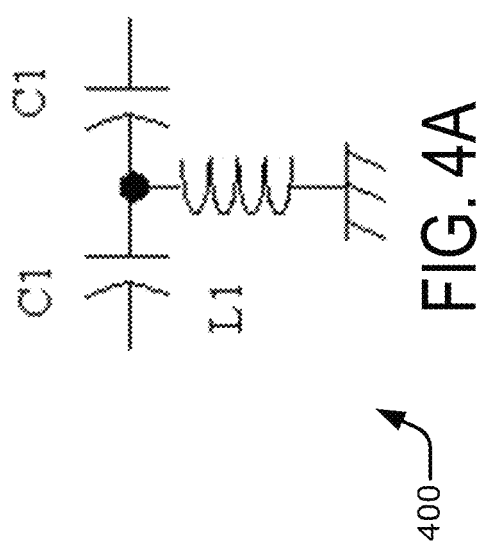
Figure 4D:
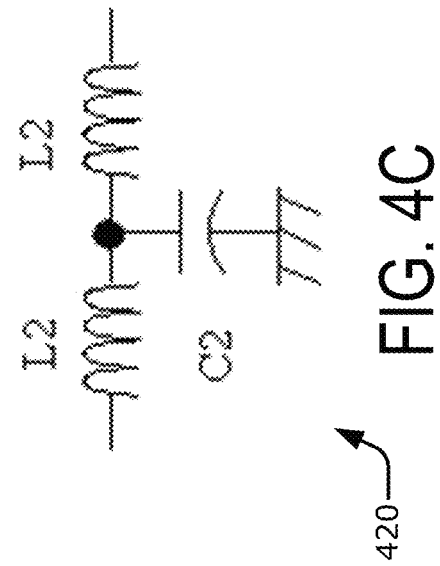

FIG. 4C is a diagram showing low pass tee phase-shifting circuitry 420. This circuitry 420 comprises two inductors L2, L2 coupled together in series, and both coupled to a capacitor C2. The capacitor is in a shunt path as illustrated. FIG. 4D is a diagram showing low pass pi phase-shifting circuitry 430. This circuitry 430 comprises an inductor L4 coupled to two capacitors C4, C4, where a first capacitor C4 is coupled to a first end of the inductor L4, and a second capacitor C4 is coupled to a second end of the inductor L4, with the capacitors C4 in parallel (e.g., in shunt paths).

It should be noted that the phase-shifting circuitry 400, 430 of FIGS. 4A and 4D each comprises two capacitors, and the phase-shifting circuitry 410, 420 of FIGS. 4B and 4C each comprises only one capacitor. The changing of the capacitors' values of the phase-shifting circuitry changes the amount of phase shift in the signal. A greater number of capacitors in the phase-shifting circuitry allows for a more refined tuning of the phase of the signal. As such, the phase-shifting circuitry 400, 430 of FIGS. 4A and 4D, which each comprise two capacitors, allows for a more refined tuning of the phase than the phase-shifting circuitry 410, 420 of FIGS. 4B and 4C, which each comprise only a single capacitor. The example circuit blocks of FIGS. 4A, 4B, 4C, and 4D as implementations of the matching/phase shifting circuitry 640 of FIG. 6, the low gain circuitry 840 of FIG. 8, or any other such low gain circuitry described herein. The phase-shifting circuits described herein illustrate several examples that may be employed. Other examples of phase-shifting circuits can be used in other implementations not specifically described herein in accordance with the details provided herein.

Figure 5:
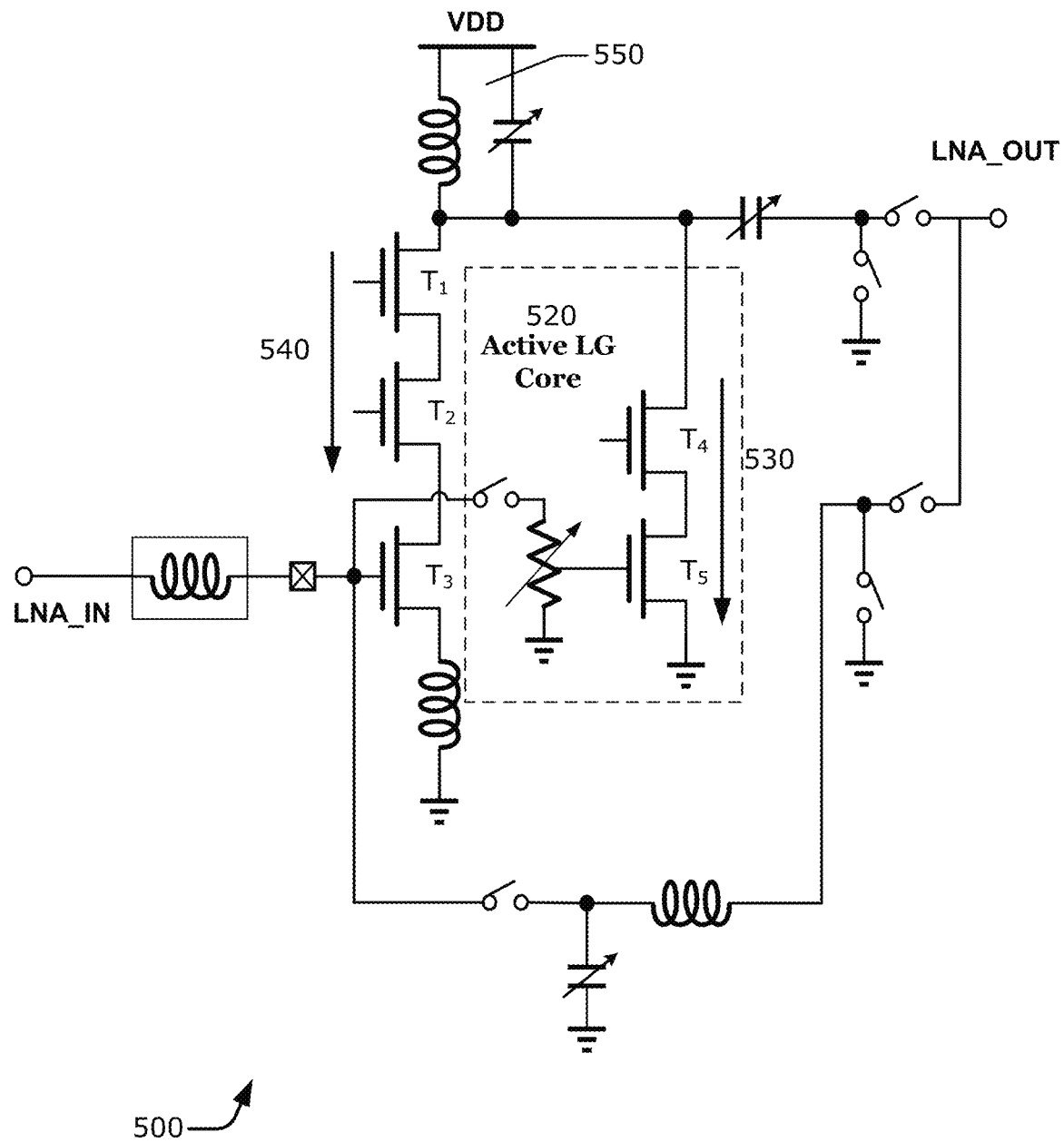
FIG. 5 is a diagram of an LNA, in accordance with examples described herein.

FIG. 5 is a diagram of an LNA 500 with phase compensation, which includes an active low gain (LG) circuitry 520. In this figure, the LNA 500 comprises transistors $T_4$ and $T_5$ to resolve any discontinuity in the phase of the outputted signal of the LNA 500. The active low gain circuitry 520 provides an active low gain path 530 that has very low current and very low gain, which may even be a negative gain, with an input attenuator. Since the high gain active path 540, which comprises transistors $T_1$, $T_2$, $T_3$, and the active low gain path 530 are both coupled to the same matching network 550, the phase difference between the signals within the high gain active path 540 and the active low gain path 530 may be small.

However, it should be noted that the LNA 500 design has the disadvantage of the active low gain path 530 having a poor noise figure because additional input loss is added to compensate for the high gain and to improve the linearity. However, the linearity is still poor because the active low gain path 530 is an active path (e.g., it comprises active circuitry components, namely transistors $T_4$ and $T_5$). The LNA 500 design also has the disadvantage of the active low gain path 530 consuming some of the current.

Figure 6:
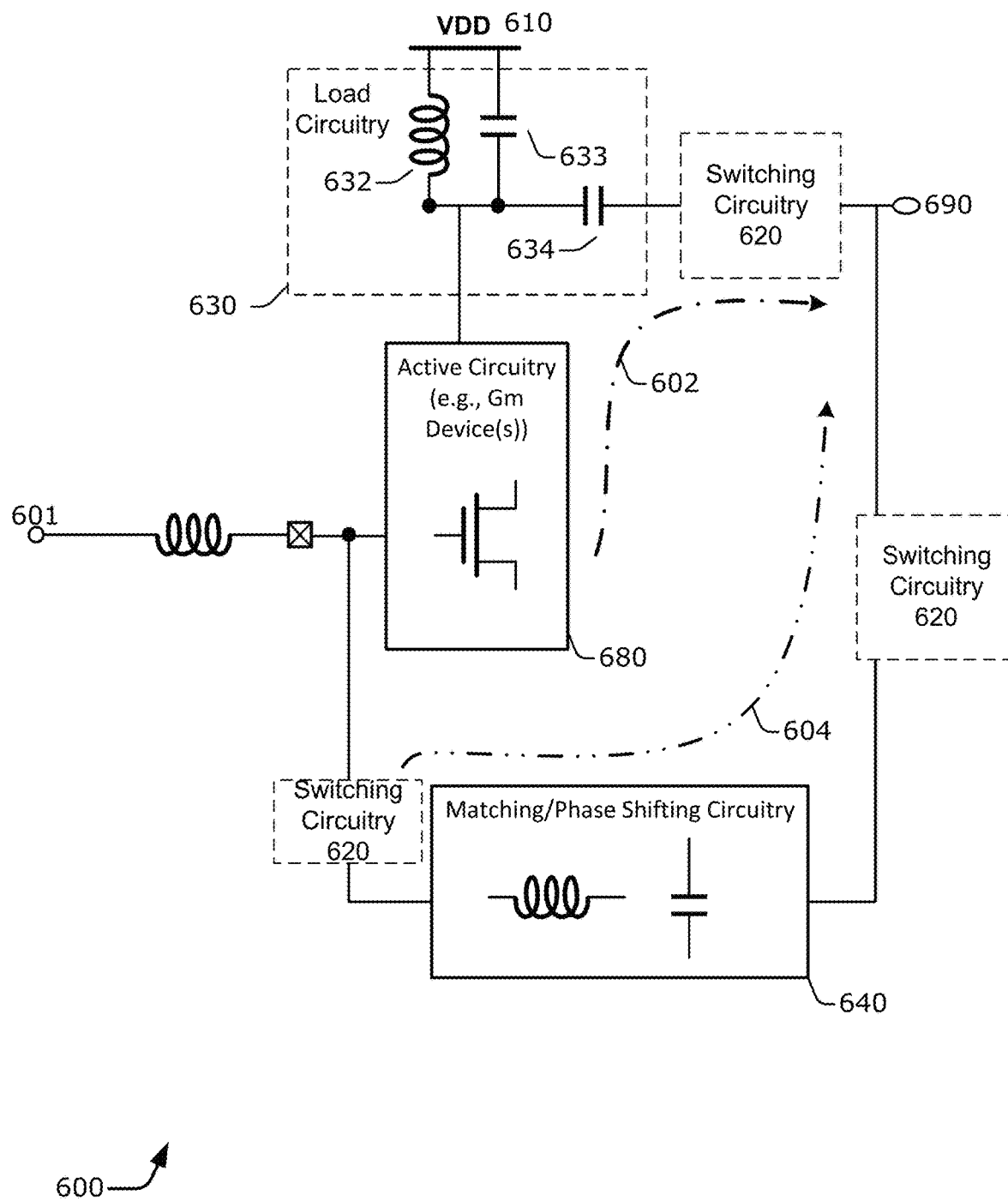
FIG. 6 is a diagram of an LNA with phase compensation, which comprises active low gain circuitry to provide for phase shifting.

FIG. 6 is a diagram of an implementation of an LNA 600 in accordance with the details provided herein. The LNA 600 includes a high gain path 602 coupled between the input 601 and the output 690 and comprising active circuitry 680 (e.g., T1/T2/T3 of FIG. 3, or other such gain providing elements which may include one or more transistors). The LNA 600 additionally includes a low gain passive path 604 coupled between the input 601 and the output 690 and comprising matching/phase-shifting circuitry 640. The matching/phase-shifting circuitry 640 is configured to shift a phase of an input signal (e.g., received at the input 601) within the low gain path 604 (e.g., which may be a low gain passive path) such that the phase of an output signal at the output 690 of the amplifier from the low gain path 604 approximately matches a phase of the output signal at the output 690 of the amplifier from the high gain path 602 (e.g., which may be a high gain active path), and wherein a gain of the high gain path 602 is higher than a gain of the low gain path 604. As described herein, such an approximate match can be a match such that the phase of the output signal from the low gain path 604 is within plus or minus fifteen degrees (±15°) of the phase of the output signal from the high gain path 602.

Figure 8:
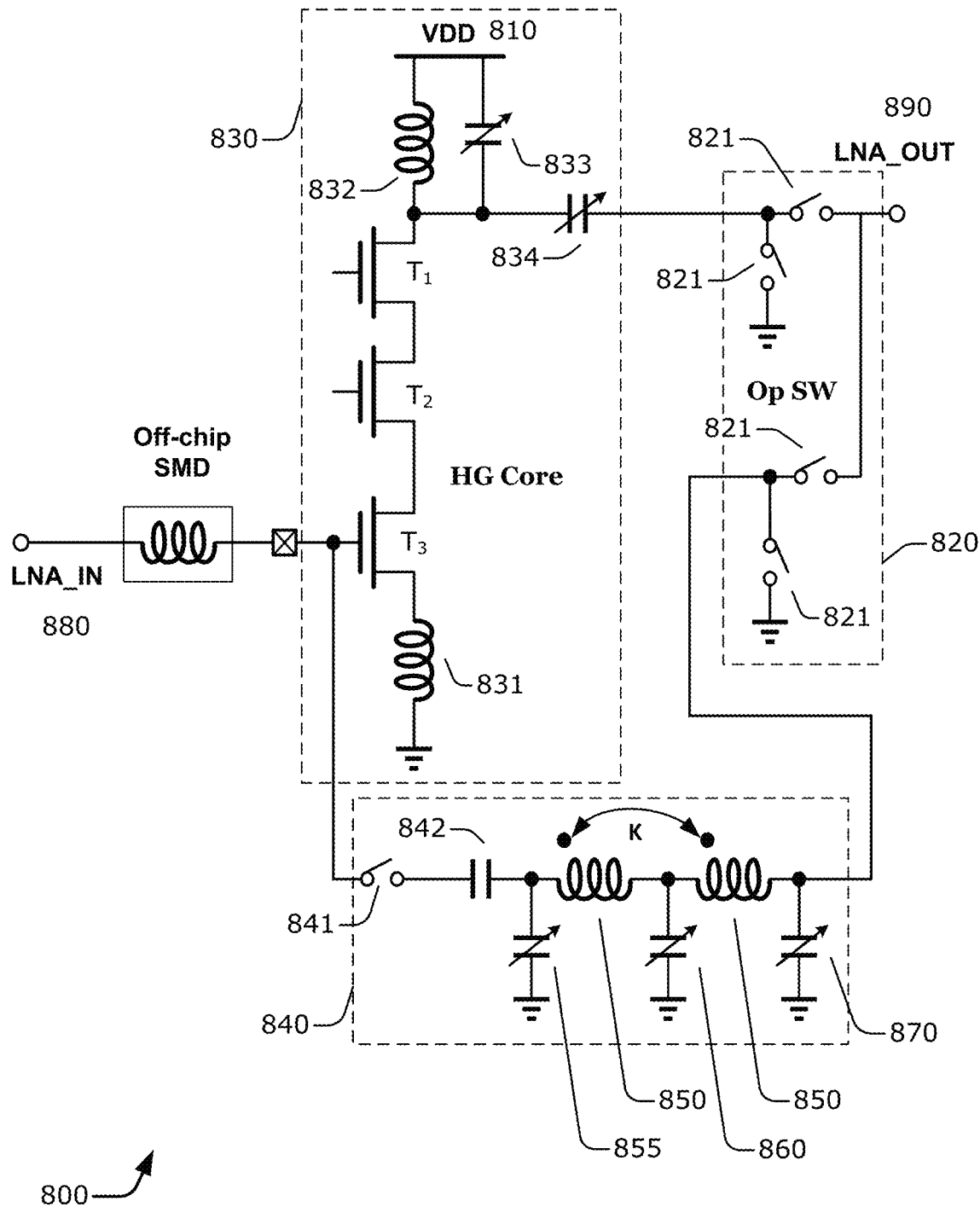
FIG. 8 is a diagram of an LNA comprising phase-shifting circuitry, in accordance with examples described herein.

The matching/phase shifting circuitry 640 may be implemented as any of various different phase-shifting circuitry 400, 410, 420, 430 of FIG. 4A-4D, matching/phase shifting circuitry 640 of FIG. 6, the low gain circuitry 840 of FIG. 8, any other such low gain circuitry described herein, or other such low gain circuitry that can operate in accordance with the details provided herein.

The LNA 600 illustrated by FIG. 6 additionally includes switching circuitry 620 and load circuitry 630. The switching circuitry 620 can be used to select between the high gain path 602 and the low gain path 604. In various implementations, the location of switching circuitry and the number of switching circuitry 620 block may vary, such that the switch structure to enable switching between each path varies (e.g., to select whether the low gain or high gain path provides a signal to the output). The load circuitry 630 includes an inductor 632 that connects a voltage $V_{DD}$ 610 to the high gain path 602 and a capacitor 633 that connects the voltage $V_{DD}$ 610 to the high gain path 602, such that the inductor 632 and the capacitor 633 are in parallel. The load circuitry 630 additionally includes a capacitor 634 in the high gain path 602 to connect the active circuitry 680 to the output 690. Load circuitry 630 works as an output matching network, and the configuration is not limited to the example shown in FIG. 6. In other implementations, other designs may be used. Different designs may affect the phase of path 602, and will subsequently affect the component values of phase shifting circuitry 640 for better phase matching.

During operation, when any switching circuitry 620 is configured appropriately, the high gain path 602 comprising the active circuitry 680 takes an input signal (e.g., a second signal having a second phase), and the high gain path 602 provides a first signal having a first phase to the output 690. Similarly, when the switching circuitry 620 provides the second signal having the second phase to the low gain path 604, the low gain path 604 provides a third signal having a third phase to the output 690. As the active circuitry 680 and/or load circuitry may adjust a phase of an input signal differently from the low gain path 604, the differential phase adjustment applied by each path may result in performance or design issues. In accordance with examples described herein, the matching/phase shifting circuitry 640 can be configured (e.g., via switching selection, variable capacitor settings, etc.) to match the third signal (e.g., the output of the low gain path 604) phase to the first signal (e.g., the output of the high gain path 602) phase. The low gain path 604 may also, in some examples, be referred to as a bypass path which bypasses the active circuitry 680 and consists of only passive devices and provides low or negative gain. The issue of phase mismatch is not only limited between an active path and a bypass path, but can be between two active paths or two bypass paths. While examples described herein show an active path and a bypass path with phase adjustment circuitry to match the phase outputs, it will be apparent that other implementations may be structured with multiple active paths or multiple bypass paths.

Figure 7:
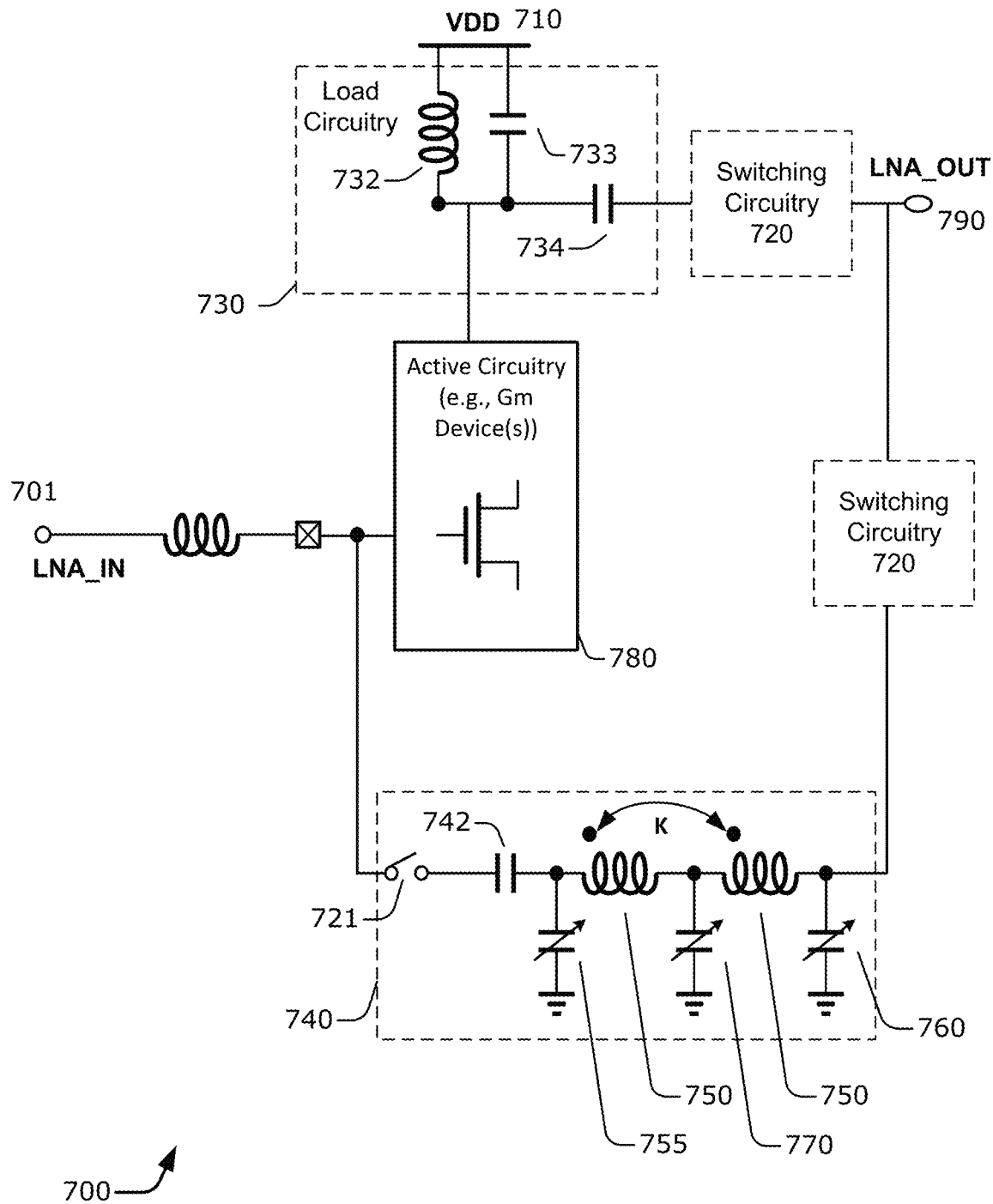
FIG. 7 is a diagram of an LNA comprising phase-shifting circuitry, in accordance with examples described herein.

FIG. 7 is a diagram of an implementation of an LNA 700 in accordance with the details provided herein. The LNA 700 includes a similar structure to the LNA 700, but with a specific implementation of the matching/phase shifting circuitry 640 shown as low gain circuitry 740. The LNA 700 includes an input 701 and an output 790, along with active circuitry 780 (e.g., as part of a high gain path) along with a voltage $V_{DD}$ 710 and load circuitry 730 including an inductor 732, a capacitor 733, and a capacitor 734 in the same configuration described in FIG. 6. The LNA 700 additionally includes the low gain circuitry 740 as part of a low gain path. Just as described above, the low gain circuitry 740 is configured to shift a phase of an input signal (e.g., received at the input 701) within the low gain path such that the phase of an output signal at the output 690 of the amplifier from the low gain path 604 approximately matches a phase of the output signal at the output 790 of the amplifier from the high gain path, and where a gain of the high gain path (e.g., from the active circuitry 780) is higher than a gain of the low gain path (e.g., including the low gain circuitry 740).

The LNA 700 additionally includes switching circuitry 720 that can be configured to select between the active circuitry and the low gain circuitry 740. The LNA 700 of FIG. 7 includes a specific implementation of low gain circuitry, including a capacitor 742 in series with other elements of the low gain circuitry 740 that are configured as phase shifting circuitry. The low gain circuitry 740 additionally includes an inductor 750, a first capacitor 755, a second capacitor 760, and a third capacitor 770. In some implementations, the low gain circuitry 740 can be described as phase shifting circuitry including at least one inductor (e.g., the inductor 750) and at least one capacitor (e.g., the capacitor 755). In some aspects, some or all of the at least on capacitor of the low gain circuitry 740 (e.g., some or all of the capacitors 755, 760, 770) are tunable capacitors that are configured to tune an amount of shift of the phase of the input signal within the low gain passive path. In some aspects, such tuning can be implemented with switches (not shown) in series with the (shunt) capacitors 755, 760, 770. When open, such shunt switches can effectively limit the impact of the corresponding capacitors on the performance of the circuit block. In such aspects and other aspects, at least one of the at least one capacitor(s) (e.g., the capacitors 755, 760, 770) is configured to be disabled to disable the phase-shifting circuitry such that the phase of the input signal within the low gain passive path is not shifted. Such phase shifting circuitry can provide a means for shifting a phase of a signal in the low gain path such that the phase of an output signal at the output of the amplifier from the low gain path approximately matches a phase of the output signal at the output of the amplifier from the high gain path, and wherein a gain of the high gain path is higher than a gain of the low gain path. In some implementations, such an approximate match can be a match such that the two signals within plus or minus fifteen degrees of each other. In other implementations, other such match thresholds can be used to meet design performance targets.

In some aspects, at least one inductor of the phase-shifting circuitry (e.g., the inductor 750) forms at least a portion of an impedance matching circuit. In other implantations, low gain circuitry can be configured with at least one inductor tied to ground to form a transformer, or using a center-tapped inductor.

The low gain circuitry 740 can be configured for phase-shifting in different ways in different implementations. In some aspects, the phase shifting circuitry of the low gain circuitry includes the inductor 750 coupled in series between the input 701 and the output 790 of the LNA. The phase shifting circuitry of the low gain circuitry 740 further includes the first capacitor 755 and the second capacitor 760 (e.g., shunt capacitors coupled between the signal path and a reference voltage or ground), with the inductor 750 coupled between the first (shunt) capacitor 755 and the second (shunt) capacitor 760. In some implementations, the inductor 750 is a single inductor with a characteristic value K, and where the inductor 750 is tapped by a third (shunt) capacitor 770. As indicated above, such shunt capacitors (e.g., the third capacitor 770), can be coupled in parallel to a switch (not shown).

The implementation of the LNA 700 additionally includes a switch 721 coupled between the input 701 and the inductor 750. The switch 721 can be an implementation of switching circuitry (e.g., the switching circuitry 620) included with the low gain circuitry 740. In other implementations, additional combinations of switches can be included with the LNA 700 and the switching circuitry 720 to manage path selection, gain, and other aspects of device performance. Additional details related to an implementation of low gain circuitry similar to the low gain circuitry 740 is described below with respect to FIG. 8

FIG. 8 is a diagram of the disclosed LNA 800 comprising phase-shifting circuitry, in accordance with examples described herein. In this figure, LNA 800 is similar to the LNA 500 of FIG. 5, except that the LNA 800 comprises additional phase-shifting circuitry in the LG circuitry 840 to provide for phase-shifting to resolve any discontinuity in the phase of the outputted signal of the LNA 800. Similar to the LNA 500 of FIG. 5, the LNA 800 comprises an Op SW 820, a HG circuitry 830, and a LG circuitry 840. The Op SW 820 comprises a plurality of switches 821. The switches 821 within the Op SW 820 are used for switching between the HG circuitry 830 and the LG circuitry 840, and for changing the gain settings (or gain modes).

The HG circuitry 830, which comprises three transistors $T_1$, $T_2$, $T_3$, provides the high gain active path of the LNA 800. The HG circuitry 830 also comprises inductors 831, 832 and capacitors 833, 834, which may be variable capacitors. Inductor 832 and capacitor 833 of the HG circuitry 830 are both connected to a power supply voltage VDD 810. Inductor 832 and capacitor 833 form an LNA load and provide output matching (e.g., together with capacitor 834). The inductor 832 and capacitor 833 provide just one example of an LNA load, but other configurations are possible.

The LG circuitry 840 provides the low gain path of the LNA 800. The LG circuitry 840 of the LNA 800 comprises phase-shifting circuitry comprising a center-tapped inductor 850. The phase-shifting circuitry is in the form of a low pass pi (refer to 430 of FIG. 4D), and provides for approximately up to 180 degrees in phase shift of the signal. It should be noted that the impedance matching inductor 350 of the LNA 300 of FIG. 3 is repurposed as the inductor 850 for the phase-shifting circuitry of the LG circuitry 840 of the LNA 800. As such, the inductor 850 of LNA 800 provides for phase shifting as well as impedance matching (e.g., the inductor 850 forms a portion of impedance matching circuitry).

The phase-shifting circuitry in the LNA 800 further includes a capacitor 842 that may be provided for increasing/boosting the Q. Capacitors 855, 860, and 870, may be implemented as variable capacitors. The capacitor 842 makes the circuitry network of the LG circuitry 840 a high Q network that can be configured to correct for any phase slope (e.g., the rate of change of the phase) differences between the signal outputted from the HG circuitry 830 of the LNA 800 and the signal outputted from the LG circuitry 840 of the LNA 800. The switch 841 and capacitor 855, which is a variable capacitor in this design, can be designed existing components that are being reused or reconfigured in accordance with aspects described herein to serve a dual purpose. Since an inductor may already be present or needed in the low gain path in a design for purposes of impedance matching (or other purposes), this inductor may be used for the dual purpose of phase-shifting and impedance matching and therefore doesn't require a large increase in the size of area of the device in order to accomplish the phase shifting.

During operation, the LNA 800 receives a signal from a receive antenna or other signal conditioning circuitry such as one or more filters (not shown) at the input 880 of the LNA 800, and the receive signal is received at the input 880 of the LNA 800. The switches 821 within the Op SW 820 are switched to select the signal path (e.g., the HG circuitry 830 or the LG circuitry 840) and the gain setting. The signal passes through the LNA 800 via at least one of the two signal paths (e.g., via the HG circuitry 830 or the LG circuitry 840) and at one of the gain settings. When the signal passes through the LG circuitry 840, the phase-shifting circuitry (e.g., including the inductor 850) performs impedance matching, and shifts the phase of the signal such that the phase of the signal outputted at the output 890 of LNA 800 from the LG circuitry 840 matches the phase of the signal that would be outputted at the output 890 of the LNA 800 from the HG circuitry 830. The signal is then outputted at the output 890 of the LNA 800.

It should be noted that at least one of the capacitors 855, 860, 870 in the LG circuitry 840 may be disabled to disable the phase-shifting circuitry such that the phase of the signal within the low gain passive path of the LG circuitry 840 is not shifted.

It should also be noted that, in one or more examples, different phase-shifting circuitry (e.g., refer to the different types of phase-shifting circuitry shown in FIGS. 4A, 4B, 4C, and 4D) may be employed within the LG circuitry 840 of LNA 800 to provide for phase-shifting.

Figure 9:
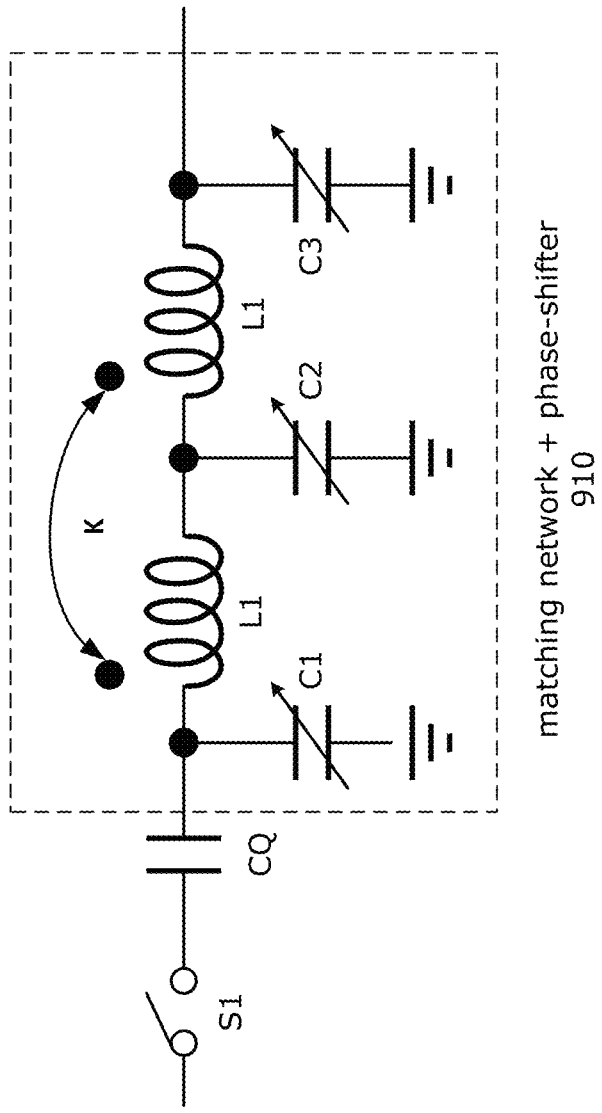
FIG. 9 is a diagram of an exemplary disclosed low gain circuit block of the disclosed LNA comprising phase-shifting circuitry, which uses an existing impedance matching inductor for phase shifting and employs a Q-boosting capacitor, in accordance with examples described herein.
Figure 10:
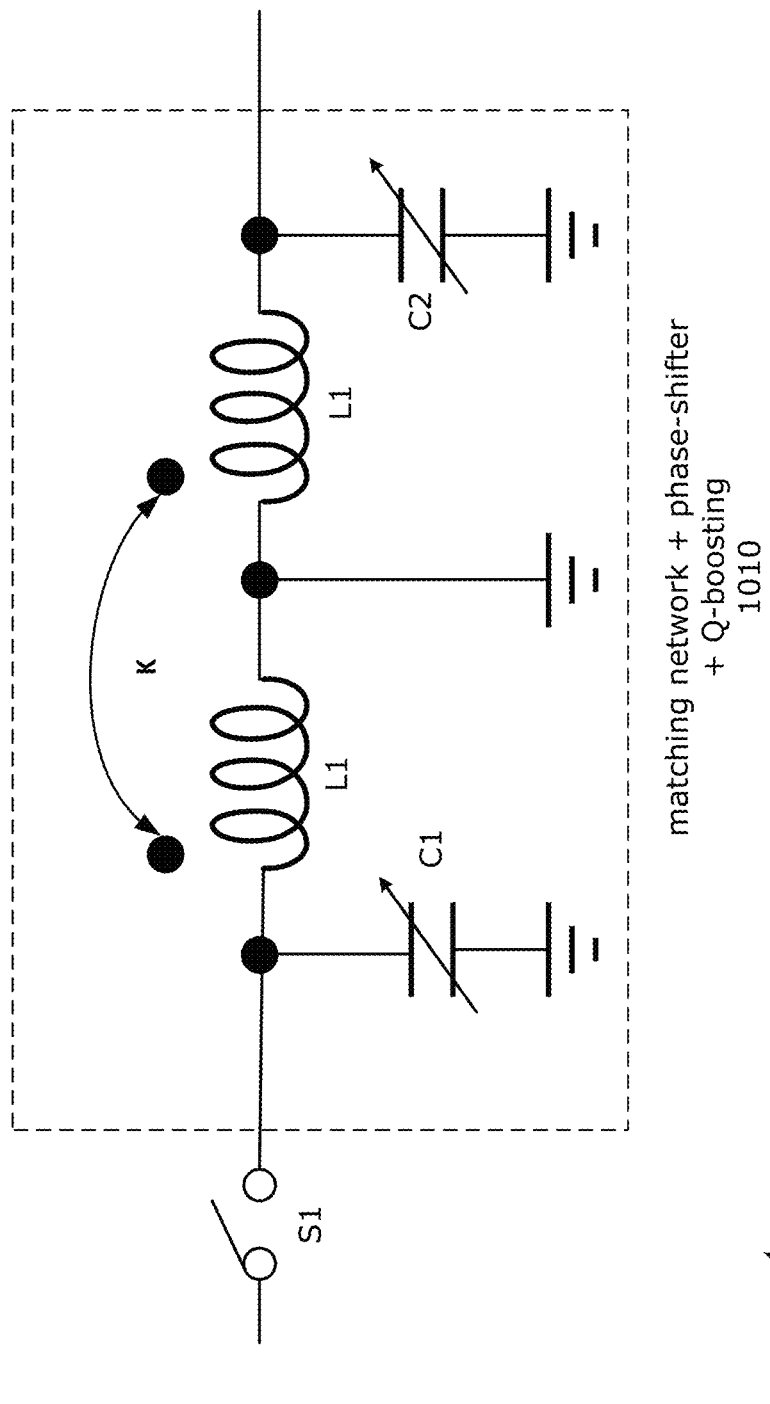
FIG. 10 is a diagram of another exemplary disclosed low gain circuit block of the disclosed LNA comprising phase-shifting circuitry, which uses an existing impedance matching inductor for phase shifting, in accordance with examples described herein.

FIGS. 9 and 10 show exemplary disclosed phase-shifting circuitry 910, 1010 configurations that may be implemented within a low gain passive path of LG circuitry of an LNA for phase-shifting to resolve any discontinuity in phase at the output of the LNA. In particular, FIG. 9 is a diagram of an exemplary disclosed LG circuitry 900 of the disclosed LNA comprising phase-shifting circuitry 910, which uses an impedance matching inductor L1 for phase shifting and employs a Q-boosting capacitor CQ, in accordance with examples described herein. The phase-shifting circuitry 910 of FIG. 9 provides for approximately up to positive 180 degrees in phase shift of the signal.

The phase-shifting circuitry 910 comprises a center-tapped inductor L1 and three capacitors C1, C2, C3. For the phase-shifting circuitry 910 of the LG circuitry 900, an impedance matching inductor L1 is center-tapped and is utilized to provide for phase-shifting as well as impedance matching.

Phase-shifting capacitors C1, C2, C3 are also included within the phase-shifting circuitry 910 of the LG circuitry 900. The capacitors C1, C2, C3 are tunable capacitors that can be used for tuning the amount of phase shift in the signal. It should be noted that the phase-shifting circuitry 910 can be disabled if no phase-shifting is desired for the LG circuitry 900 by simply disabling one or more of the phase-shifting capacitors C1, C2, C3.

A series capacitor (e.g., a Q-boosting capacitor) CQ is included in the low gain passive path of the LG circuitry 900 to make the circuitry network of the LG circuitry 900 a high Q network. Making the circuitry network of the LG circuitry 900 a high Q network corrects for any phase slope (e.g., the rate of change of the phase) differences between the signal outputted from a high gain active path of an HG circuitry (not shown) of the LNA and the signal outputted from the low gain passive path of the LG circuitry 900 of the LNA. As described herein, some implementations may use switches to bypass or disconnect certain elements as part of LNA operation. In some implementations using low gain circuitry similar to LG circuitry 900, a switch is configured in parallel to the series Qboost capacitor CQ to allow the low gain circuitry to be configurable to modify, reduce, or eliminate the impact of the capacitor CQ on operation of a corresponding LNA when the switch is in a closed position. Similarly, in some implementations, switches may be placed in series with capacitors C2 and C3 to provide increased configurability of the low gain circuitry (e.g., with the series switches modifying, reducing, or eliminating the impact of the capacitors C2 and C3 on the low gain circuitry when in an open position).

This phase-shifting circuitry 910 is in the configuration of a low pass tee (refer to 420 of FIG. 4C). It should be noted that, in one or more examples, different phase-shifting circuitry (e.g., refer to the different types of phase-shifting circuitry shown in FIGS. 4A, 4B, and 4D) may be employed within the low gain passive path of the disclosed LG circuitry of the disclosed LNA to provide for phase-shifting other than the phase-shifting circuitry 910 as shown in the low gain passive path of LG circuitry 900 in FIG. 9.

During operation of the disclosed LNA, when an input signal passes through the low gain passive path of the LG circuitry 900, the phase-shifting circuitry 910 performs impedance matching and shifts the phase of the signal. The phase of the signal is shifted such that the phase of the signal outputted from the LNA from the low gain passive path of the LG circuitry 900 matches the phase of the signal outputted from the LNA from the high gain active path of the HG circuitry (not shown). The signal is then outputted from the LNA.

FIG. 10 is a diagram of another exemplary disclosed LG circuitry 1000 of the disclosed LNA comprising phase-shifting circuitry 1010, which uses an existing impedance matching inductor L1 for phase shifting, in accordance with examples described herein. In this figure, the LG circuitry 1000 is similar to the LG circuitry 900 of FIG. 9, except that the phase-shifting circuitry 1010 of LG circuitry 1000 of FIG. 10 does not require the use of a series capacitor (e.g., refer to CQ of FIG. 9) to make the circuitry network of the LG circuitry 1000 of high Q network. The phase-shifting circuitry 1010 of FIG. 10 provides for approximately down to negative 180 degrees in phase shift of the signal.

The phase-shifting circuitry 1010 comprises a center-tapped inductor L1 and two capacitors C1, C2. For the phase-shifting circuitry 1010 of the LG circuitry 1000, an existing impedance matching inductor L1 is center-tapped and is utilized to provide for phase-shifting as well as impedance matching. The center of the inductor L1 is coupled to ground such that the inductor L1 forms a traditional transformer.

Phase-shifting capacitors C1, C2 are also included within the phase-shifting circuitry 1010 of the LG circuitry 1000. The capacitors C1, C2 are tunable capacitors that can be used for tuning the amount of phase shift in the signal. If no phase shifting is desired, the phase-shifting circuitry 1010 can be disabled by simply disabling one or more of the phase-shifting capacitors C1, C2.

The phase-shifting circuitry 1010 of the LG circuitry 1000 makes the circuitry network of the LG circuitry 1000 a high Q network, which corrects for any phase slope (e.g., the rate of change of the phase) differences between the signal outputted from a high gain active path of an HG circuitry (not shown) of the LNA and the signal outputted from the low gain passive path of the LG circuitry 1000 of the LNA.

During operation of the disclosed LNA, when an input signal passes through the low gain passive path of the LG circuitry 1000, the phase-shifting circuitry 1010 performs impedance matching and shifts the phase of the signal. The phase of the signal is shifted such that the phase of the signal outputted from the LNA from the low gain passive path of the LG circuitry 1000 matches the phase of the signal outputted from the LNA from the high gain active path of the HG circuitry (not shown). Then, the signal is outputted from the LNA.

Figure 11:
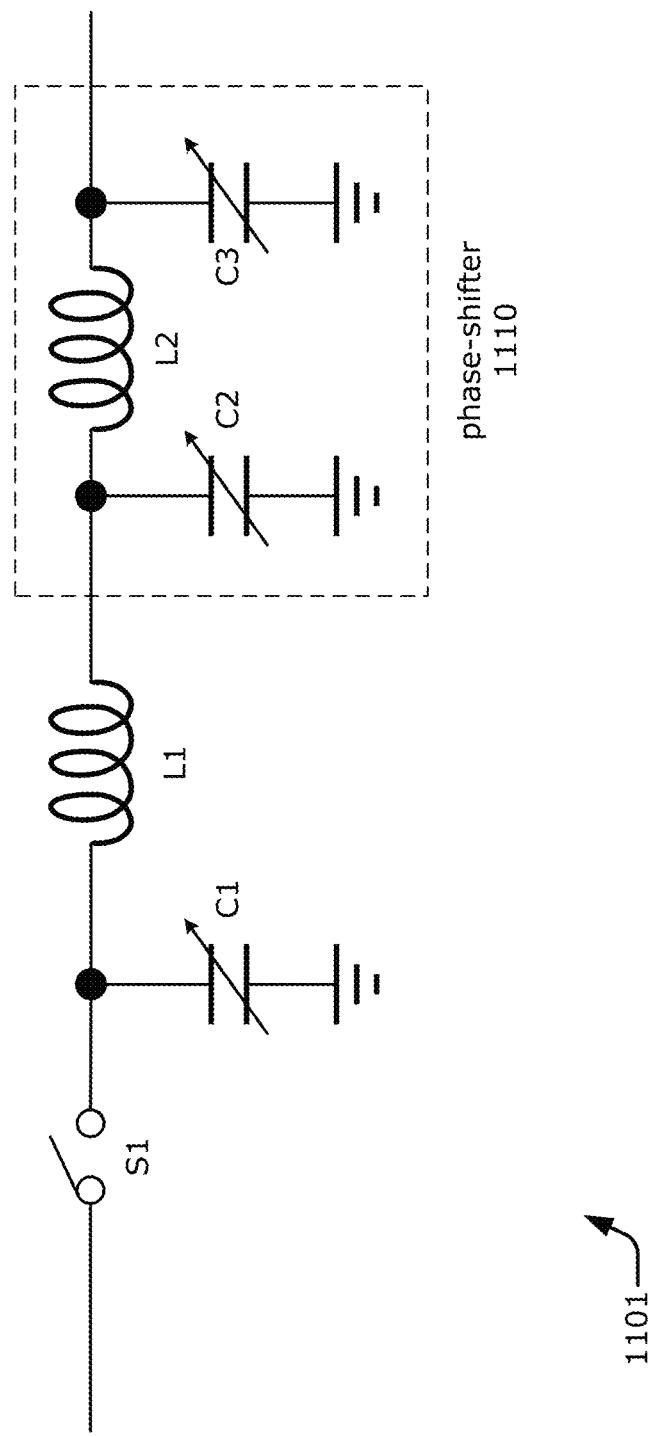
FIG. 11 is a diagram of a low gain circuit block, in accordance with examples described herein.

FIG. 11 is a diagram of an exemplary LG circuitry 1101 of an LNA with phase compensation employing an additional inductor L2. The phase-shifting circuitry 1110 in the low gain passive path of the LG circuitry 1101 provides for phase-shifting to resolve any discontinuity in the phase of the outputted signal of the LNA.

The phase-shifting circuitry 1110 comprises an additional inductor L2 and two capacitors C2, C3. Implementing an additional inductor L2 may potentially occupy a greater chip area for the implementation as compared to the LG circuitry of FIGS. 9/10.

Figure 12:
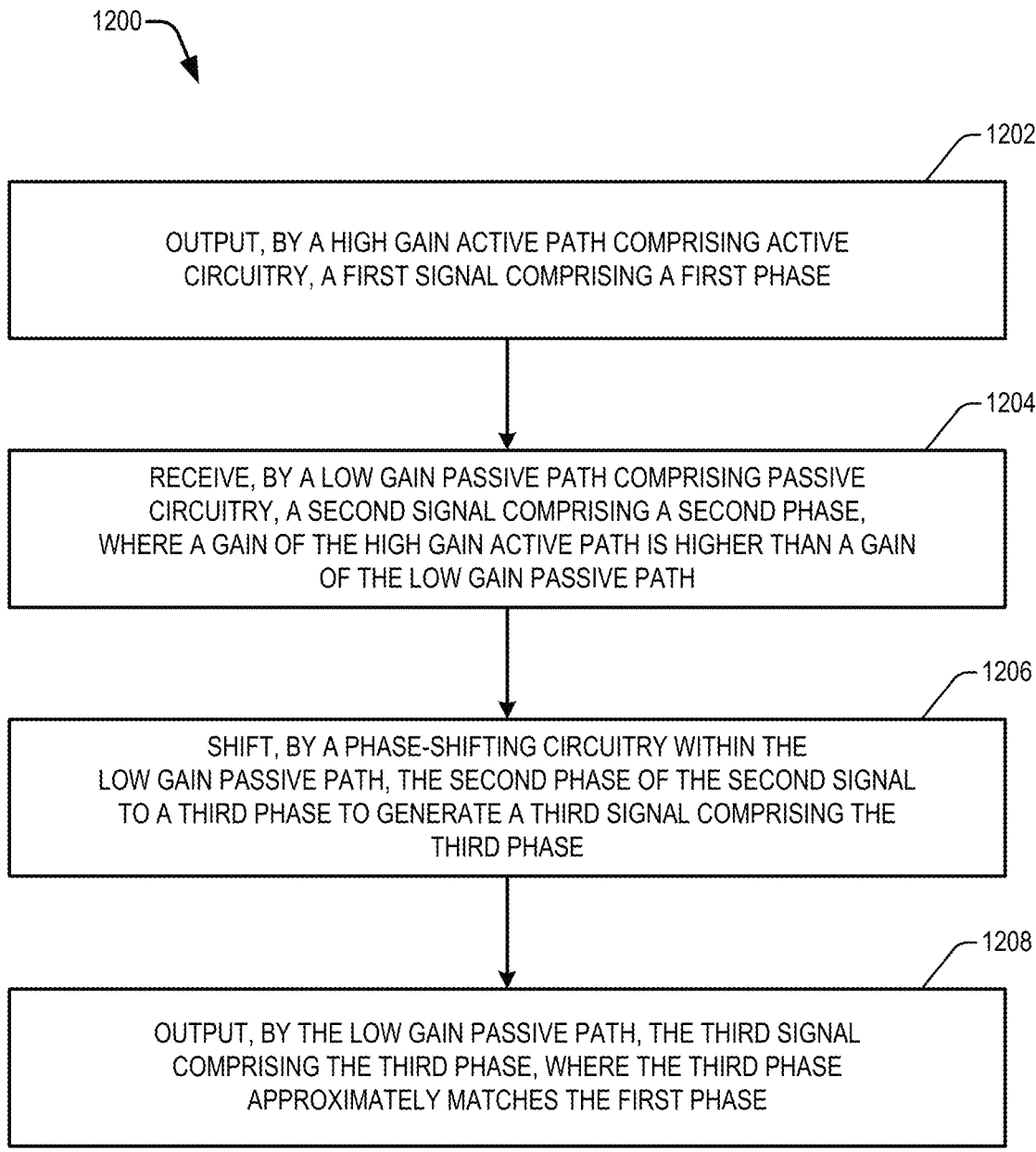
FIG. 12 is a flowchart illustrating a method of operation of the disclosed LNA comprising phase-shifting circuitry, in accordance with examples described herein.

FIG. 12 is a flowchart illustrating a method 1200 of operation of the disclosed LNA comprising phase-shifting circuitry (e.g., refer to LNA 800 of FIG. 8), in accordance with examples described herein. The method 1200 is described in the form of a set of blocks that specify operations that can be performed. However, operations are not necessarily limited to the order shown in FIG. 12 or described herein, for the operations may be implemented in alternative orders or in fully or partially overlapping manners. Also, more, fewer, and/or different operations may be implemented to perform the method 1200, or an alternative approach.

The method 1200 includes block 1202 where, a high gain active path (e.g., HG circuitry 830 of FIG. 8), comprising active circuitry (e.g., transistors $T_1$, $T_2$, $T_3$ of FIG. 8), outputs a first signal having a first phase. The first signal is a result of amplification and changes occurring to an input signal (e.g., a second signal having a second phase) that occur within the high gain active path. The method 1200 includes block 1204, where a low gain passive path (e.g., LG circuitry 840 of FIG. 8), comprising passive circuitry (e.g., inductors 850 and capacitors 860, 870 of FIG. 8), receives the second signal (e.g., the input signal) having a second phase. As described herein, the second (e.g., input) signal is modified in different ways by low and high gain paths, and so the low gain passive path includes phase shifting circuitry to match the phase at the output of the low gain path to the phase at the output of the high gain active path to improve performance (e.g., signal quality) when a switch occurs at the output between using the low gain path and the high gain path. In one or more examples, a gain of the high gain active path is higher than a gain of the low gain passive path. The method 1200 includes block 1206, where phase-shifting circuitry, within the low gain passive path, shifts the second phase of the second signal to a third phase to generate a third signal having the third phase. The method 1200 includes block 1208, where the low gain passive path outputs the third signal having the third phase, where the third phase approximately matches the first phase.

Additional illustrative aspects of the disclosure include:

Aspect 1: An amplifier having an input and an output and comprising: a high gain path coupled between the input and the output and comprising active circuitry; and a low gain path coupled between the input and the output and comprising phase-shifting circuitry, wherein the phase-shifting circuitry is configured to shift a phase of an input signal within the low gain path such that the phase of an output signal at the output of the amplifier from the low gain path approximately matches a phase of the output signal at the output of the amplifier from the high gain path, and wherein a gain of the high gain path is higher than a gain of the low gain path.

Aspect 2: The amplifier of aspect 1, wherein the phase-shifting circuitry comprises at least one inductor and at least one capacitor.

Aspect 3: The amplifier of aspect 2, wherein at least one of the at least one capacitor is a tunable capacitor that is configured to tune an amount of shift of the phase of the input signal within the low gain path.

Aspect 4: The amplifier of any of aspects 2 through 3, wherein at least one of the at least one capacitor is configured to be disabled to disable the phase-shifting circuitry such that the phase of the input signal within the low gain path is not shifted.

Aspect 5: The amplifier of any of aspects 2 through 4, wherein at least one of the at least one inductor of the phase-shifting circuitry forms at least a portion of an impedance matching circuit.

Aspect 6: The amplifier of any of aspects 2 through 5, wherein at least one of the at least one inductor is a center-tapped inductor.

Aspect 7: The amplifier of any of aspects 1 through 6, further comprising a capacitor in series with the phase shifting circuitry.

Aspect 8: The amplifier of any of aspects 1 through 7, wherein the phase shifting circuitry comprises an inductor coupled in series between the input and the output of the amplifier, the phase shifting circuitry further comprising a first shunt capacitor and a second shunt capacitor, the inductor coupled between the first shunt capacitor and the second shunt capacitor.

Aspect 9: The amplifier of aspect 8, wherein the first shunt capacitor and the second shunt capacitor are variable capacitors.

Aspect 10: The amplifier of any of aspects 8 through 9, wherein the inductor is tapped by a third shunt capacitor.

Aspect 11: The amplifier of aspect 10, wherein the third shunt capacitor is coupled in parallel to a switch.

Aspect 12: The amplifier of any of aspects 8 through 11, further comprising a capacitor coupled in series with the inductor, the first shunt capacitor coupled between the capacitor and the inductor.

Aspect 13: The amplifier of any of aspects 8 through 12, wherein the inductor forms a portion of an impedance matching network of the low gain path.

Aspect 14: The amplifier of any of aspects 8 through 13, further comprising a switch coupled between the input and the inductor.

Aspect 15: The amplifier of any of aspects 1 through 14, wherein the phase-shifting circuitry provides for at least one of a positive 180 degrees phase shift or a negative 180 degrees phase shift.

Aspect 16: The amplifier of aspect 1, wherein the phase-shifting circuitry comprises two capacitors coupled together in series and coupled to one inductor.

Aspect 17: The amplifier of aspect 1, wherein the phase-shifting circuitry comprises a first inductor coupled to a first end of a capacitor, and a second inductor coupled to a second end of the capacitor.

Aspect 18: The amplifier of aspect 1, wherein the phase-shifting circuitry comprises two inductors coupled together in in series, and a shunt capacitor having a first end coupled between the two inductors and a second end coupled to ground.

Aspect 19: The amplifier of aspect 1, wherein the phase-shifting circuitry comprises a first capacitor coupled to a first end of an inductor, and a second capacitor coupled to a second end of the inductor.

Aspect 20: The amplifier of any of aspects 1 through 19, wherein the active circuitry comprises at least one transistor having a gate coupled to an input of the amplifier, a source coupled to ground, and a load coupled between a power supply and a drain of the at least one transistor.

Aspect 21: The amplifier of any of aspects 1 through 20, wherein the amplifier is a low noise amplifier (LNA), and wherein the gain of the low gain path is approximately zero such that the low gain path is a bypass path bypassing the active circuitry of the high gain path.

Aspect 22: A method of operation for an amplifier, the method comprising: outputting, by a high gain active path comprising active circuitry, a first signal comprising a first phase; receiving, by a low gain passive path comprising passive circuitry, a second signal comprising a second phase, wherein a gain of the high gain active path is higher than a gain of the low gain passive path; shifting, by a phase-shifting circuitry within the low gain passive path, the second phase of the second signal to a third phase to generate a third signal comprising the third phase; and outputting, by the low gain passive path, the third signal comprising the third phase, wherein the third phase approximately matches the first phase.

Aspect 23: The method of aspect 22, wherein the phase-shifting circuitry comprises at least one inductor and at least one capacitor, and wherein at least one of the at least one capacitor is a tunable capacitor that is configured to tune an amount of shift of the second phase of the second signal within the low gain passive path.

Aspect 24: The method of any of aspects 22 through 23, further comprising disabling the phase-shifting circuitry such that the second phase of the second signal within the low gain passive path is not shifted.

Aspect 25: The method of any of aspects 23 through 24, wherein at least one of the at least one inductor provides for phase-shifting and impedance matching.

Aspect 26: The method of any of aspects 23 through 25, wherein one of the at least one capacitor is a series capacitor that provides for an improved quality factor (Q) for the amplifier, which corrects for any phase slope differences between the third phase of the third signal outputted from the low gain passive path and the first phase of the first signal outputted from the high gain active path.

Aspect 27: An amplifier comprising: phase-shifting circuitry, within a bypass path of the amplifier, the bypass path bypassing one or more gain providing elements in an active path of the amplifier, the phase-shifting circuitry comprising an inductor and at least one capacitor, wherein the inductor provides both impedance matching and phase-shifting of at least one signal within the bypass path of the amplifier.

Aspect 28: An amplifier having an output and comprising: a high gain path coupled to the output and comprising active circuitry; and a low gain path coupled to the output and comprising means for shifting a phase of a signal in the low gain path such that the phase of an output signal at the output of the amplifier from the low gain path approximately matches a phase of the output signal at the output of the amplifier from the high gain path, and wherein a gain of the high gain path is higher than a gain of the low gain path.

Aspect 29: The amplifier of aspect 28, wherein the phase of the output signal at the output of the amplifier from the low gain path is within ±15° of the phase of the output signal at the output of the amplifier from the high gain path.

Aspect 30: A computer readable storage medium comprising instructions that, when executed by one or more processors of a device, cause the device to perform operations according to any of aspects 1 through 30.

Aspect 31: An apparatus comprising one or more means for performing operations according to any of aspects 1 through 31.

Aspect 32: A method for operating a device in accordance with any of aspects 1 through 32.

Figure 13:
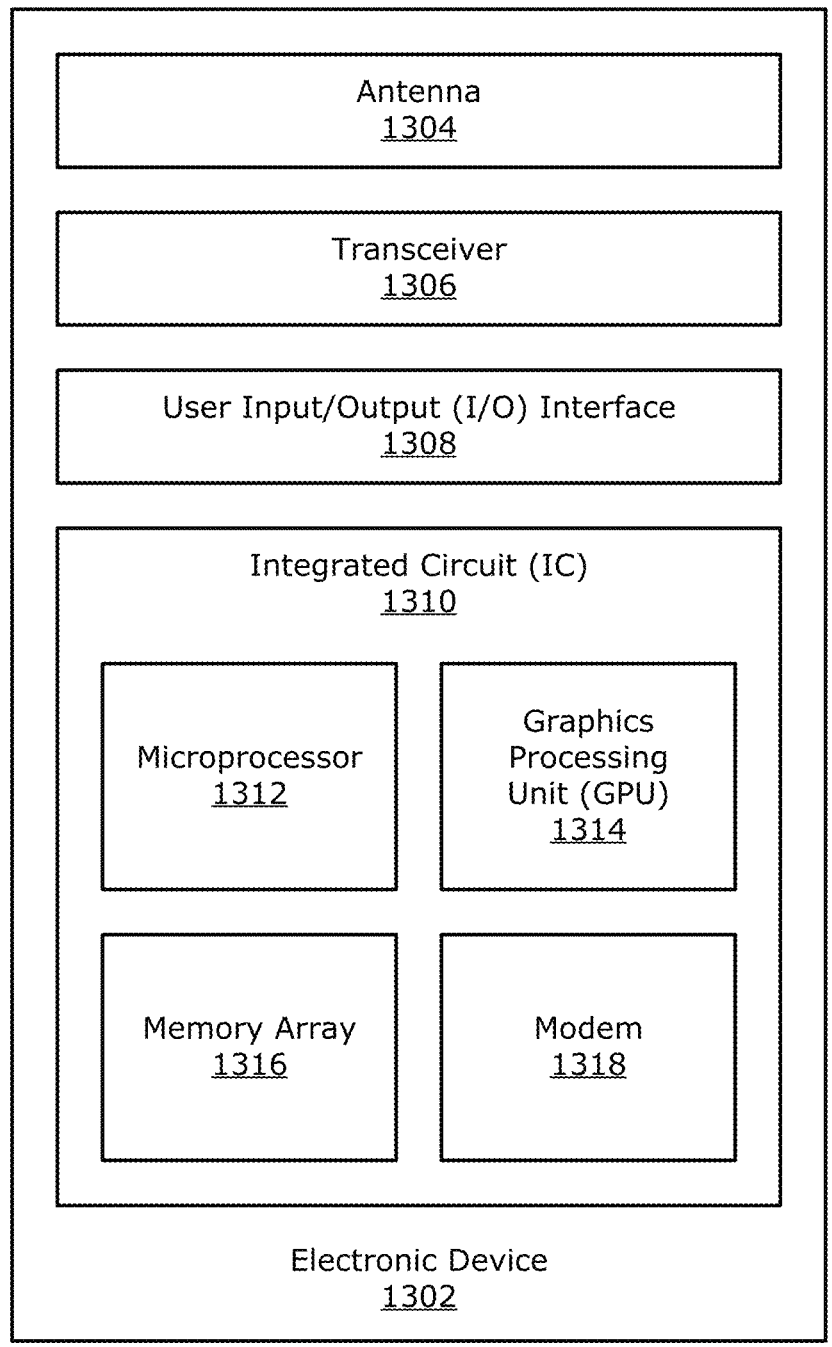
FIG. 13 illustrates an example electronic device, which includes a transceiver that can implement the disclosed LNA comprising phase-shifting circuitry, in accordance with examples described herein.

FIG. 13 illustrates an example electronic device 1302, which includes a transceiver 1306 that can implement the disclosed LNA comprising phase-shifting circuitry (e.g., refer to LNA 800 of FIG. 8), in accordance with examples described herein. As shown, the electronic device 1302 includes an antenna 1304, a transceiver 1306, and a user input/output (I/O) interface 1308, in addition to the integrated circuit 1310. Illustrated examples of the integrated circuit 1310 include a microprocessor 1312, a graphics processing unit (GPU) 1314, a memory array 1316, and a modem 1318. Each component can be operably coupled to another component, such as the GPU 1314 being operably coupled to the user I/O interface 1308.

The electronic device 1302 can be a mobile or battery-powered device or a fixed device that is designed to be powered by an electrical grid. Examples of the electronic device 1302 include a server computer, a network switch or router, a blade of a data center, a personal computer, a desktop computer, a notebook or laptop computer, a tablet computer, a smart phone, an entertainment appliance, or a wearable electronic device such as a smartwatch, intelligent glasses, or an article of clothing. An electronic device 1302 can also be a device, or a portion thereof, having embedded electronics. Examples of the electronic device 1302 with embedded electronics include a passenger vehicle, industrial equipment, a refrigerator or other home appliance, a drone or other unmanned aerial vehicle (UAV), or a power tool.

For an electronic device with a wireless capability, the electronic device 1302 includes an antenna 1304 that is coupled to a transceiver 1306 to enable reception or transmission of one or more wireless signals. The integrated circuit 1310 may be coupled to the transceiver 1306 to enable the integrated circuit 1310 to have access to received wireless signals or to provide wireless signals for transmission via the antenna 1304. The electronic device 1302 as shown also includes at least one user I/O interface 1308. Examples of the user I/O interface 1308 include a keyboard, a mouse, a microphone, a touch-sensitive screen, a camera, an accelerometer, a haptic mechanism, a speaker, a display screen, or a projector. The transceiver 1306 can correspond to, for example, the wireless transceiver 122 (e.g., of FIG. 1 and FIG. 2) can include the disclosed LNA comprising phase-shifting circuitry (e.g., refer to LNA 800 of FIG. 8), in accordance with examples described herein.

The integrated circuit 1310 may comprise, for example, one or more instances of a microprocessor 1312, a GPU 1314, a memory array 1316, a modem 1318, and so forth. The microprocessor 1312 may function as a central processing unit (CPU) or other general-purpose processor. Some microprocessors include different parts, such as multiple processing cores, that may be individually powered on or off. The GPU 1314 may be especially adapted to process visual related data for display, such as video data images. If visual-related data is not being rendered or otherwise processed, the GPU 1314 may be fully or partially powered down. The memory array 1316 stores data for the microprocessor 1312 or the GPU 1314. Example types of memory for the memory array 1316 include random access memory (RAM), such as dynamic RAM (DRAM) or static RAM (SRAM); flash memory; and so forth. If programs are not accessing data stored in memory, the memory array 1316 may be powered down overall or block-by-block. The modem 1318 demodulates a signal to extract encoded information or modulates a signal to encode information into the signal. If there is no information to decode from an inbound communication or to encode for an outbound communication, the modem 1318 may be idled to reduce power consumption. The integrated circuit 1310 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1310 may also comprise a system on chip (SoC). An SoC may integrate a sufficient number of different types of components to enable the SoC to provide computational functionality as a notebook computer, a mobile phone, or another electronic apparatus using one chip, at least primarily. Components of an SoC, or an integrated circuit 1310 generally, may be termed cores or circuit blocks. Examples of cores or circuit blocks include, in addition to those that are illustrated in FIG. 13, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks.

Specific details are provided in the description above to provide a thorough understanding of the embodiments and examples provided herein. However, it will be understood by one of ordinary skill in the art that the embodiments may be practiced without these specific details. For clarity of explanation, in some instances the present technology may be presented as including individual functional blocks comprising devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Individual embodiments may be described above as a process or method which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Processes and methods according to the above-described examples can be implemented using computer-executable instructions that are stored or otherwise available from computer-readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code. Examples of computer-readable media that may be used to store instructions, information used, and/or information created during methods according to described examples include magnetic or optical disks, flash memory, USB devices provided with non-volatile memory, networked storage devices, and so on.

Devices implementing processes and methods according to these disclosures can include hardware, software, firmware, middleware, microcode, hardware description languages, or any combination thereof, and can take any of a variety of form factors. When implemented in software, firmware, middleware, or microcode, the program code or code segments to perform the necessary tasks (e.g., a computer-program product) may be stored in a computer-readable or machine-readable medium. A processor(s) may perform the necessary tasks. Typical examples of form factors include laptops, smart phones, mobile phones, tablet devices or other small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific embodiments thereof, but those skilled in the art will recognize that the application is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described application may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

One of ordinary skill will appreciate that the less than ("<") and greater than (">") symbols or terminology used herein can be replaced with less than or equal to ("≤") and greater than or equal to ("≥") symbols, respectively, without departing from the scope of this description.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The phrase "coupled to" refers to any component that is physically or electrically connected to another component either directly or indirectly, and/or any component that is in communication with another component (e.g., connected to the other component over a wired or wireless connection, and/or other suitable communication interface) either directly or indirectly.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The various illustrative logical blocks, modules, circuits, and algorithm steps described in connection with the examples disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods, algorithms, and/or operations described above. The computer-readable data storage medium may form part of a computer program product, which may include packaging materials. The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein.

What is claimed is:

1. An amplifier having an input and an output and comprising:
a high gain path coupled between the input and the output and comprising active circuitry; and a low gain path coupled between the input and the output and comprising phase-shifting circuitry, wherein the phase-shifting circuitry is configured to shift a phase of an input signal within the low gain path such that the phase of an output signal at the output of the amplifier from the low gain path approximately matches a phase of the output signal at the output of the amplifier from the high gain path, and wherein a gain of the high gain path is higher than a gain of the low gain path, wherein the phase shifting circuitry comprises an inductor coupled in series between the input and the output of the amplifier, the phase-shifting circuitry further comprising a first shunt capacitor and a second shunt capacitor, the inductor coupled between the first shunt capacitor and the second shunt capacitor, wherein the inductor is tapped by a third shunt capacitor.

2. The amplifier of claim 1, wherein at least one of the first shunt capacitor, the second shunt capacitor, and the third shunt capacitor is a tunable capacitor that is configured to tune an amount of shift of the phase of the input signal within the low gain path.

3. The amplifier of claim 1, wherein at least one of the first shunt capacitor and the second shunt capacitor is configured to be disabled to disable the phase-shifting circuitry such that the phase of the input signal within the low gain path is not shifted.

4. The amplifier of claim 1, wherein the inductor is center-tapped by the third shunt capacitor.

5. The amplifier of claim 1, further comprising a capacitor in series with the phase shifting circuitry.

6. The amplifier of claim 1, wherein the first shunt capacitor and the second shunt capacitor are variable capacitors.

7. The amplifier of claim 1, wherein the third shunt capacitor is coupled in parallel to a switch.

8. The amplifier of claim 1, further comprising a capacitor coupled in series with the inductor, the first shunt capacitor coupled between the capacitor and the inductor.

9. The amplifier of claim 1, wherein the inductor forms a portion of an impedance matching network of the low gain path.

10. The amplifier of claim 1, further comprising a switch coupled between the input and the inductor.

11. The amplifier of claim 1, wherein the phase-shifting circuitry provides for at least one of a positive 180 degrees phase shift or a negative 180 degrees phase shift.

12. The amplifier of claim 1, wherein the active circuitry comprises at least one transistor having a gate coupled to an input of the amplifier, a source coupled to ground, and a load coupled between a power supply and a drain of the at least one transistor.

13. The amplifier of claim 1, wherein the amplifier is a low noise amplifier (LNA), and wherein the gain of the low gain path is approximately zero such that the low gain path is a bypass path bypassing the active circuitry of the high gain path.

14. A method of operation for an amplifier, the method comprising:

outputting, by a high gain active path comprising active circuitry, a first signal comprising a first phase;

receiving, by a low gain passive path comprising passive circuitry, a second signal comprising a second phase, wherein a gain of the high gain active path is higher than a gain of the low gain passive path;

shifting, by a phase-shifting circuitry within the low gain passive path, the second phase of the second signal to a third phase to generate a third signal comprising the third phase; and outputting, by the low gain passive path, the third signal comprising the third phase, wherein the third phase approximately matches the first phase.

15. The method of claim 14, wherein the phase-shifting circuitry comprises at least one inductor and at least one capacitor, and wherein at least one of the at least one capacitor is a tunable capacitor that is configured to tune an amount of shift of the second phase of the second signal within the low gain passive path.

16. The method of claim 15, further comprising disabling the phase-shifting circuitry such that the second phase of the second signal within the low gain passive path is not shifted.

17. The method of claim 15, wherein at least one of the at least one inductor provides for phase-shifting and impedance matching.

18. The method of claim 15, wherein one of the at least one capacitor is a series capacitor that provides for an improved quality factor (Q) for the amplifier, which corrects for any phase slope differences between the third phase of the third signal outputted from the low gain passive path and the first phase of the first signal outputted from the high gain active path.

19. An amplifier having an input and an output and comprising:

a high gain path coupled between the input and the output and comprising active circuitry; and a low gain path coupled between the input and the output and comprising phase-shifting circuitry, wherein the phase-shifting circuitry is configured to shift a phase of an input signal within the low gain path such that the phase of an output signal at the output of the amplifier from the low gain path approximately matches a phase of the output signal at the output of the amplifier from the high gain path, and wherein a gain of the high gain path is higher than a gain of the low gain path, wherein the phase-shifting circuitry comprises a first inductor coupled to a first end of a capacitor, and a second inductor coupled to a second end of the capacitor.

20. An amplifier having an input and an output and comprising:

a high gain path coupled between the input and the output and comprising active circuitry; and a low gain path coupled between the input and the output and comprising phase-shifting circuitry, wherein the phase-shifting circuitry is configured to shift a phase of an input signal within the low gain path such that the phase of an output signal at the output of the amplifier from the low gain path approximately matches a phase of the output signal at the output of the amplifier from the high gain path, and wherein a gain of the high gain path is higher than a gain of the low gain path, wherein the phase-shifting circuitry comprises two inductors coupled together in series, and a shunt capacitor having a first end coupled between the two inductors and a second end coupled to ground.

* * * * *